US012652008B2

(12) United States Patent
Wang et al.

(10) Patent No.: US 12,652,008 B2
(45) Date of Patent: Jun. 9, 2026

(54) TRANSCEIVER INTERFACE WITH POWER DETECTION

(71) Applicant: QUALCOMM Incorporated, San Diego, CA (US)

(72) Inventors: Chuan Wang, San Diego, CA (US); Kai Zhan, Escondido, CA (US); Bon-Hyun Ku, San Diego, CA (US); Hyejeong Song, San Diego, CA (US); Li Liu, San Diego, CA (US); Kevin Hsi-Huai Wang, San Diego, CA (US); Muhammad Hassan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 289 days.

(21) Appl. No.: 18/471,088

(22) Filed: Sep. 20, 2023

(65) Prior Publication Data

US 2025/0096754 A1 Mar. 20, 2025

(51) Int. Cl.
| | |
|---|---|
| *H04B 1/40* | (2015.01) |
| *H03F 3/24* | (2006.01) |
| *H03F 3/45* | (2006.01) |
| *H04B 1/00* | (2006.01) |
| *H04B 1/04* | (2006.01) |

(52) U.S. Cl.
CPC .............. H03F 3/245 (2013.01); H04B 1/40 (2013.01); *H03F 2200/294* (2013.01); *H03F 2200/451* (2013.01)

(58) Field of Classification Search
None
See application file for complete search history.

(56) References Cited

U.S. PATENT DOCUMENTS

| | | | | |
|---|---|---|---|---|
| 10,715,204 B2 * | 7/2020 | Hur | ......................... | H04B 1/582 |
| 10,720,956 B2 * | 7/2020 | Callender | ................. | H03F 3/21 |
| 10,911,091 B2 * | 2/2021 | Emira | ...................... | H04B 1/44 |
| 11,380,988 B2 | 7/2022 | Hassan et al. | | |
| 11,438,131 B2 * | 9/2022 | Muharemovic | .......... | H04B 1/18 |

(Continued)

FOREIGN PATENT DOCUMENTS

WO 2023043587 A1 3/2023

OTHER PUBLICATIONS

International Search Report and Written Opinion—PCT/US2024/043400—ISA/EPO—Nov. 29, 2024.

(Continued)

*Primary Examiner* — Pablo N Tran
(74) *Attorney, Agent, or Firm* — Loza & Loza LLP

(57) ABSTRACT

An apparatus for wireless communications includes a power amplifier, a low-noise amplifier, a power detector, and a transformer. The transformer includes a first inductor coupled to an output of the power amplifier, and a second inductor coupled to an antenna, wherein the second inductor is magnetically coupled with the first inductor. The transformer also includes a third inductor coupled to an input of the low-noise amplifier, wherein the third inductor is magnetically coupled with the second inductor. The transformer also includes a coupling inductor coupled to an input of the power detector, wherein the coupling inductor is magnetically coupled with at least one of the first inductor and the second inductor.

27 Claims, 17 Drawing Sheets

(56) References Cited

U.S. PATENT DOCUMENTS

| | | | | |
|---|---|---|---|---|
| 11,522,502 | B2 * | 12/2022 | Tang ......................... | H04B 1/40 |
| 11,533,075 | B1 * | 12/2022 | Yu ............................. | H03F 3/72 |
| 11,606,070 | B1 * | 3/2023 | Abouzied ............... | H03F 3/195 |
| 11,936,357 | B2 * | 3/2024 | Din ........................ | H03H 7/004 |
| 12,483,280 | B2 * | 11/2025 | Kim ......................... | H04B 1/44 |
| 2011/0063042 | A1 | 3/2011 | Mendolia et al. | |
| 2013/0194054 | A1 | 8/2013 | Presti | |
| 2016/0315719 | A1 | 10/2016 | Jian et al. | |
| 2016/0334444 | A1 | 11/2016 | Chen et al. | |
| 2023/0090707 | A1 | 3/2023 | Toi | |
| 2023/0253346 | A1 * | 8/2023 | Hassan ................ | H10D 89/611 |
| | | | | 330/295 |
| 2023/0258699 | A1 | 8/2023 | Bellaouar et al. | |
| 2024/0080062 | A1 * | 3/2024 | Wang ....................... | H04B 1/44 |

OTHER PUBLICATIONS

Francois B., et al., "A Fully Integrated Transformer-Coupled Power Detector With 5 GHz RF PA for WLAN 802.11acin 40 nm CMOS," IEEE Journal of Solid-State Circuits, vol. 50, No. 5, May 2015, pp. 1237-1250.
Moret B., et al., "Non-Invasive Highly Integrated Transformer Power Detector for Self-Healing PA in 130nm H9SOI-FEM CMOS Technology", Proceedings of the 11th European Microwave Integrated Circuits Conference, Oct. 3-4, 2016, pp. 113-116.

* cited by examiner

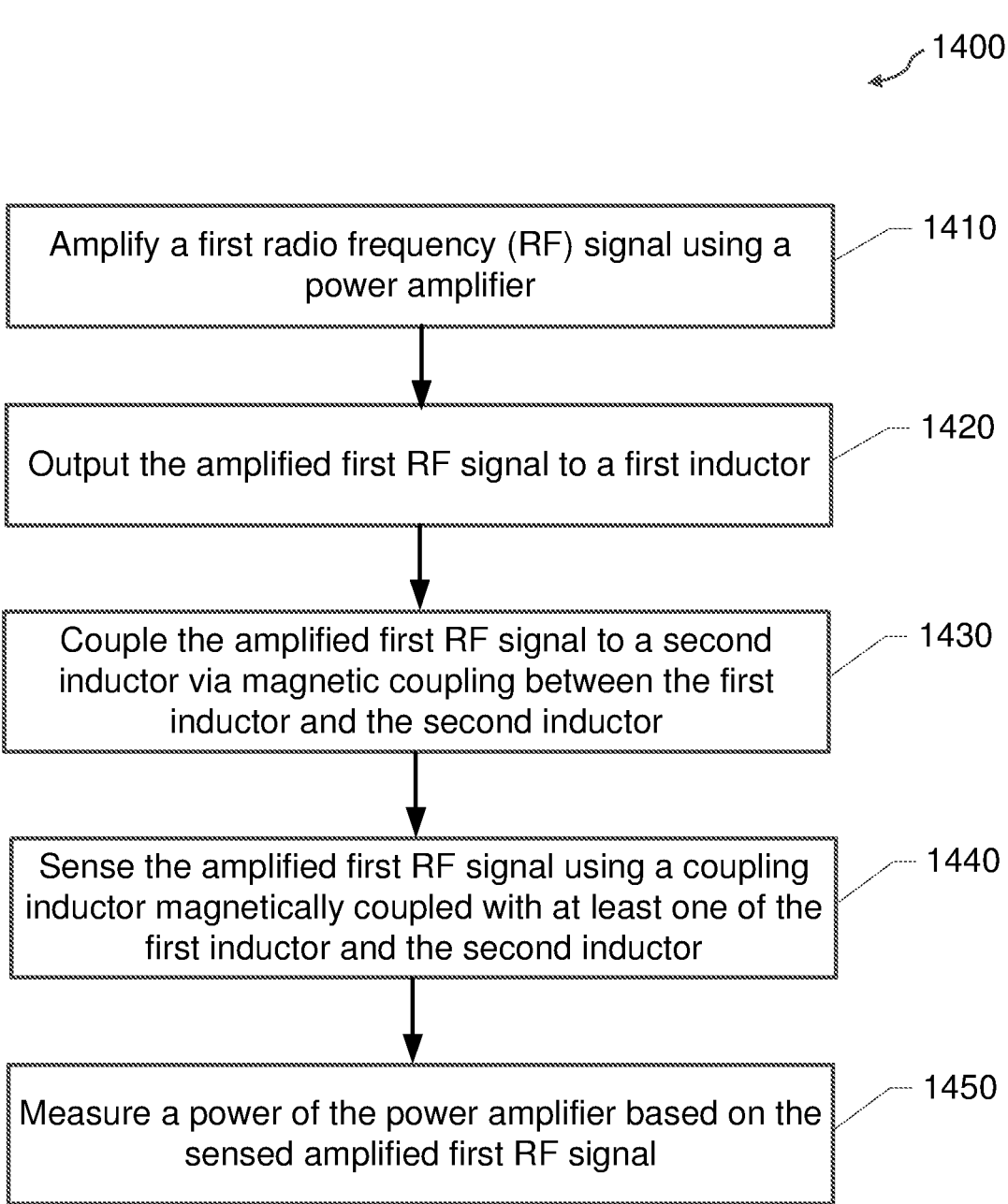

1400

Amplify a first radio frequency (RF) signal using a power amplifier — 1410

Output the amplified first RF signal to a first inductor — 1420

Couple the amplified first RF signal to a second inductor via magnetic coupling between the first inductor and the second inductor — 1430

Sense the amplified first RF signal using a coupling inductor magnetically coupled with at least one of the first inductor and the second inductor — 1440

Measure a power of the power amplifier based on the sensed amplified first RF signal — 1450

FIG. 14

TRANSCEIVER INTERFACE WITH POWER DETECTION

BACKGROUND

Field

Aspects of the present disclosure relate generally to wireless communications, and, more particularly, to power detection.

Background

A wireless device includes a transceiver for transmitting and receiving radio frequency (RF) signals via one or more antennas. The transceiver may include a power amplifier configured to amplify an RF signal for transmission via an antenna and a low-noise amplifier configured to amplify an RF signal received by the antenna. The wireless device may also include a power detector for measuring the power output to the antenna from the power amplifier, and a power controller configured to control the output power of the power amplifier based on the measured power.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to an apparatus for wireless communications. The apparatus includes a power amplifier, a low-noise amplifier, a power detector, and a transformer. The transformer includes a first inductor coupled to an output of the power amplifier, and a second inductor coupled to an antenna, wherein the second inductor is magnetically coupled with the first inductor. The transformer also includes a third inductor coupled to an input of the low-noise amplifier, wherein the third inductor is magnetically coupled with the second inductor. The transformer also includes a coupling inductor coupled to an input of the power detector, wherein the coupling inductor is magnetically coupled with at least one of the first inductor and the second inductor.

A second aspect relates to an apparatus for wireless communications. The apparatus includes a power amplifier, a low-noise amplifier, and a transformer. The transformer includes a first inductor coupled to an output of the power amplifier, a second inductor magnetically coupled with the first inductor, and a third inductor coupled to an input of the low-noise amplifier, wherein the third inductor is magnetically coupled with the second inductor. The apparatus also includes an impedance matching circuit comprising an impedance matching inductor, a power detector, a first coupling inductor coupled between the second inductor and the impedance matching circuit, and a second coupling inductor coupled to an input of the power detector, wherein the first coupling inductor is magnetically coupled with the first coupling inductor.

A third aspect relates to a method for wireless communications. The method includes amplifying a first radio frequency (RF) signal using a power amplifier, outputting the amplified first RF signal to a first inductor, coupling the amplified first RF signal to a second inductor via magnetic coupling between the first inductor and the second inductor, sensing the amplified first RF signal using a coupling inductor magnetically coupled with at least one of the first inductor and the second inductor, and measuring a power of the power amplifier based on the sensed amplified first RF signal.

BRIEF DESCRIPTION OF THE DRAWINGS

FIG. 14 is a flowchart illustrating a method for wireless communications according to certain aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
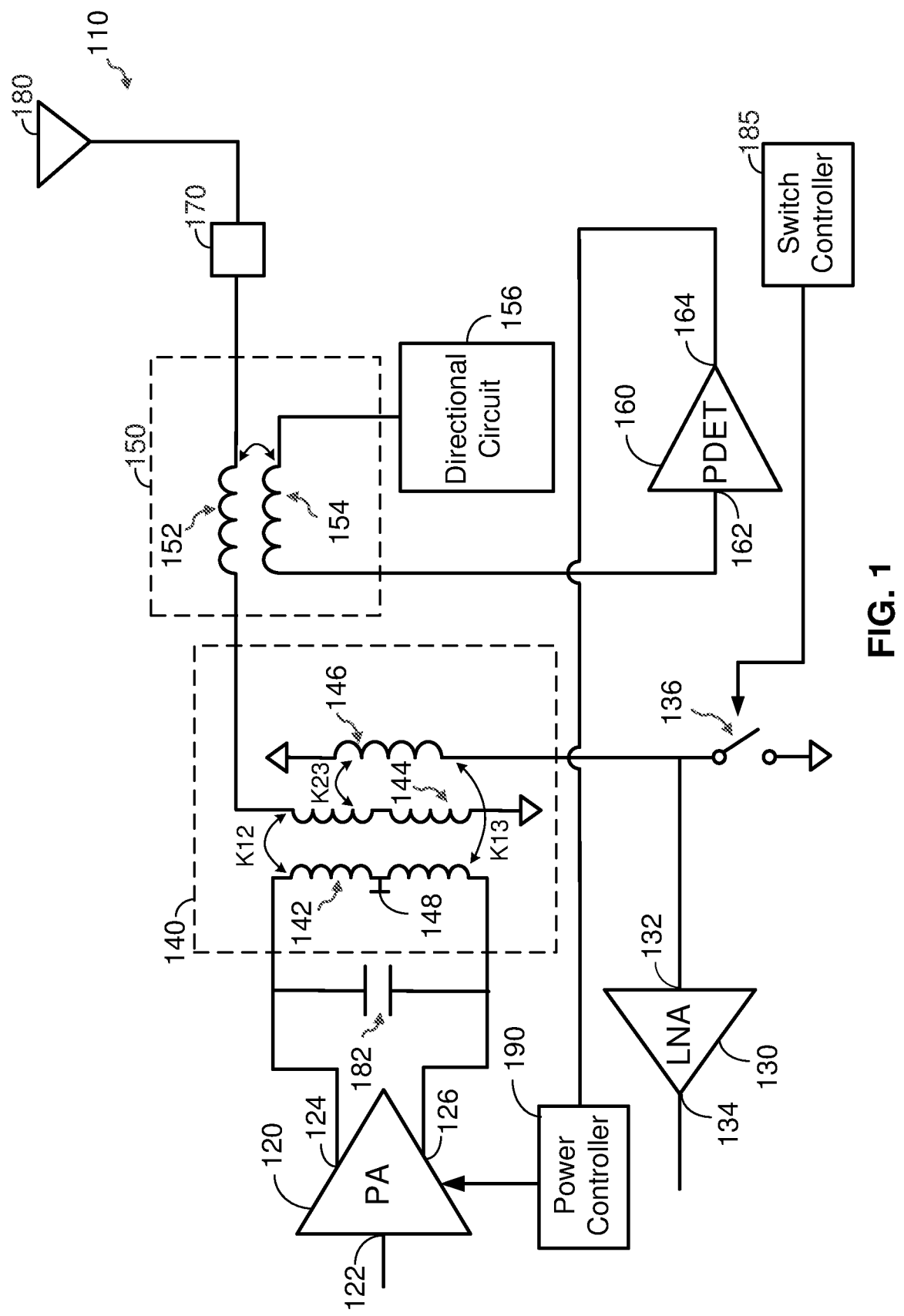
FIG. 1 shows an example of a wireless device including a power amplifier, a low-noise amplifier, a tricoil transformer, and an antenna according to certain aspects of the present disclosure.

FIG. 1 shows an example of a wireless device 110 including a power amplifier (PA) 120, a low-noise amplifier (LNA) 130, a transformer 140, and an antenna 180. The PA 120 and the LNA 130 may be part of a transceiver of the wireless device 110. The transformer 140 is configured to interface the PA 120 and the LNA 130 with the antenna 180 through magnetic coupling (i.e., inductive coupling), as discussed further below.

The wireless device 110 also includes a coupler 150 and a power detector 160. The coupler 150 is coupled between the transformer 140 and the antenna 180. The coupler 150 is configured to magnetically couple a portion of the RF signal output by the PA 120 to the power detector 160 to measure the output power of the PA 120, as discussed further below.

The coupler 150 may be coupled to the antenna 180 via an interface 170. For example, the coupler 150 and the transformer 140 may be integrated on a chip with the antenna 180 located outside the chip (i.e., off-chip). In this example, the interface 170 may include a bump (e.g., a solder bump) for bonding the chip to a metal trace on a substrate (e.g., a printed circuit board (PCB)) coupled to the antenna 180. However, it is to be appreciated that the interface 170 is not limited to this example. It is also to be appreciated that the interface 170 may include one or more other structures.

In the example in FIG. 1, the transformer 140 is a tricoil transformer including a first inductor 142, a second inductor 144, and a third inductor 146. It is to be appreciated that an inductor may also to be referred to as a coil, a winding, or another term. In certain aspects, each of the inductors 142, 144, and 146 may be implemented with a loop inductor, a spiral inductor, or another type of inductor.

In this example, the first inductor 142 and the second inductor 144 are magnetically coupled (i.e., inductively coupled), and the second inductor 144 and the third inductor 146 are magnetically coupled. In FIG. 1, the magnetic coupling between the first inductor 142 and the second inductor 144 is represented by the double arrow between the first inductor 142 and the second inductor 144, and the magnetic coupling between the second inductor 144 and the third inductor 146 is represented by the double arrow between the second inductor 144 and the third inductor 146. There may also be magnetic coupling between the first inductor 142 and the third inductor 146, which is represented by the double arrow between the first inductor 142 and the third inductor 146 in FIG. 1. The magnetic coupling between the first inductor 142 and the third inductor 146 may be unavoidable since the first inductor 142 and the third inductor 146 are both magnetically coupled to the second inductor 144.

In the example in FIG. 1, the PA 120 has an input 122 and a differential output including a first output 124 and a second output 126. The input 122 of the PA 120 may be a single-ended input or a differential input. The first inductor 142 is coupled between the first output 124 and the second output 126 of the PA 120. In this example, the center of the first inductor 142 may be coupled to a supply voltage via a center tap 148. The second inductor 144 is coupled between the antenna 180 and a ground (or some reference potential). In a transmit mode, the PA 120 is configured to receive an RF signal at the input 122 of the PA 120, amplify the RF signal, and output the amplified RF signal to the first inductor 142. The amplified RF signal is transferred from the first inductor 142 to the second inductor 144 through the magnetic coupling between the first inductor 142 and the second inductor 144. The RF signal then propagates from the second inductor 144 to the antenna 180 through the coupler 150 and the interface 170 for transmission via the antenna 180.

In certain aspects, the magnetic coupling between the first inductor 142 and the second inductor 144 has a high coupling coefficient K12 where the coupling coefficient K12 (also referred to as the coupling factor) is a measure of the magnetic coupling strength between the first inductor 142 and the second inductor 144. For example, the coupling coefficient K12 may be equal to or greater than 0.8, but is not limited to this example. The high coupling coefficient K12 provides efficient power transfer from the first inductor 142 to the second inductor 144 for the RF signal in the transmit mode.

The third inductor 146 is coupled between the input 132 of the LNA 130 and a ground (or some reference potential). In a receive mode, the second inductor 144 receives an RF signal via the antenna 180. The received RF signal is then transferred from the second inductor 144 to the third inductor 146 coupled to the input 132 of the LNA 130 through the magnetic coupling between the second inductor 144 and the third inductor 146. The LNA 130 is configured to amplify the received RF signal, and output the amplified RF signal at the output 134 of the LNA 130 to other components (e.g., a mixer) in the wireless device 110 for further processing. The third inductor 146 may also be used to provide impedance matching for the input 132 of the LNA 130. The output 134 of the LNA 130 may be a single-ended output or a differential output.

In certain aspects, the magnetic coupling between the second inductor 144 and the third inductor 146 has a moderate to high coupling coefficient K23 where the coupling coefficient K23 is a measure of the magnetic coupling strength between the second inductor 144 and the third inductor 146. For example, the coupling coefficient K23 may be equal to or greater than 0.5, but is not limited to this example. The moderate to high coupling coefficient K23 helps ensure adequate power transfer from the second inductor 144 to the third inductor 146 for the LNA 130 to sense the RF signal from the antenna 180.

In the example in FIG. 1, the wireless device 110 also includes a switch 136 coupled between the input 132 of the LNA 130 and a ground (or some reference potential), and a switch controller 185 configured to control the on/off state of the switch 136. In the transmit mode, the switch controller 185 turns on the switch 136 to couple the input 132 of the LNA 130 to the ground (e.g., to protect the input 132 of the LNA 130 from large-amplitude RF signals in the transmit mode). In the receive mode, the switch controller 185 turns off the switch 136.

As discussed above, the coupler 150 is configured to magnetically couple a portion of the RF signal output by the PA 120 to the power detector 160 to measure the output power. The coupler 150 includes a first coupling inductor 152 and a second coupling inductor 154 magnetically coupled with the first coupling inductor 152. In FIG. 1, the magnetic coupling between the first coupling inductor 152 and the second coupling inductor 154 is represented by the double arrow between the first coupling inductor 152 and the second coupling inductor 154.

The first coupling inductor 152 is coupled between the transformer 140 and the interface 170 (e.g., bump), and the second coupling inductor 154 is coupled between the input 162 of the power detector 160 (also referred to as a power sensor) and a directional circuit 156. The coupler 150 is configured to magnetically couple a portion of the RF signal passing through the first coupling inductor 152 to the second coupling inductor 154 to sample (i.e., sense) the RF signal for power detection.

The directional circuit 156 is configured to direct the portion of the RF signal coupled to the second coupling inductor 154 to the input 162 of the power detector 160. The power detector 160 measures the power of the RF signal based on the portion of the RF signal input to the power detector 160, and outputs the measured power to a power controller 190 coupled to the output 164 of the power detector 160 and the PA 120. The power controller 190 is configured to adjust the power of the PA 120 based on the measured power to achieve a target output power. For example, the power controller 190 may increase the power of the PA 120 if the measured power is below the target output power, and decrease the power of the PA 120 of the measured power is above the target output power. The power controller 190 may adjust the power of the PA 120 by adjusting one or more of the following parameters: the gain of the PA 120, the supply voltage of the PA 120, one or more bias voltages of the PA 120, and/or another parameter known in the art.

In the transmit mode, low power loss between the PA 120 and the antenna 180 is desired and loadline flatness over a wide frequency range (e.g., impedance matching between the PA 120 and the transformer 140 over the wide frequency range) is desired. In the receive mode, a low noise figure (NF) with optimum noise matching is desired. A challenge with the coupler 150 is that it is very difficult to achieve both low power loss and loadline flatness in the transmit mode and low NF in the receive mode using the coupler 150. This is because the first coupling inductor 152 of the coupler 150 increases the power loss between the PA 120 and the antenna 180 and produces a frequency-dependent impedance that negatively impacts loadline flatness. A large capacitor 182 may be used between the PA 120 and the transformer 140 to improve the loadline flatness. However, the large capacitor 182 increases receive mode loss, which increases the NF in the receive mode. Thus, using a large capacitor 182 to improve the loadline flatness comes at the expense of a higher NF in the receive mode. In other words, the coupler 150 suffers from a tradeoff between loadline flatness in the transmit mode and low NF in the receive mode.

To address the above, aspects of the present disclosure include a coupling inductor for the power detector 160 inside the transformer that interfaces the PA 120 and the LNA 130 with the antenna 180. Including the coupling inductor inside the transformer eliminates the need for a separate coupling inductor (e.g., the first coupling inductor 152) between the transformer and the antenna 180. The elimination of the separate coupling inductor reduces transmission power loss between the transformer and the antenna 180, and eliminates the frequency-dependent impedance produced by the separate coupling inductor. This allows the use of a smaller capacitor between the PA 120 and the transformer for a lower NF in the receive mode while still achieving good loadline flatness over a wide frequency range in the transmit mode. Including the coupling inductor inside the transformer also eliminates the need for the second coupling inductor 154 shown in FIG. 1, which provides a large area reduction for power detection, as discussed further below.

Figure 2:
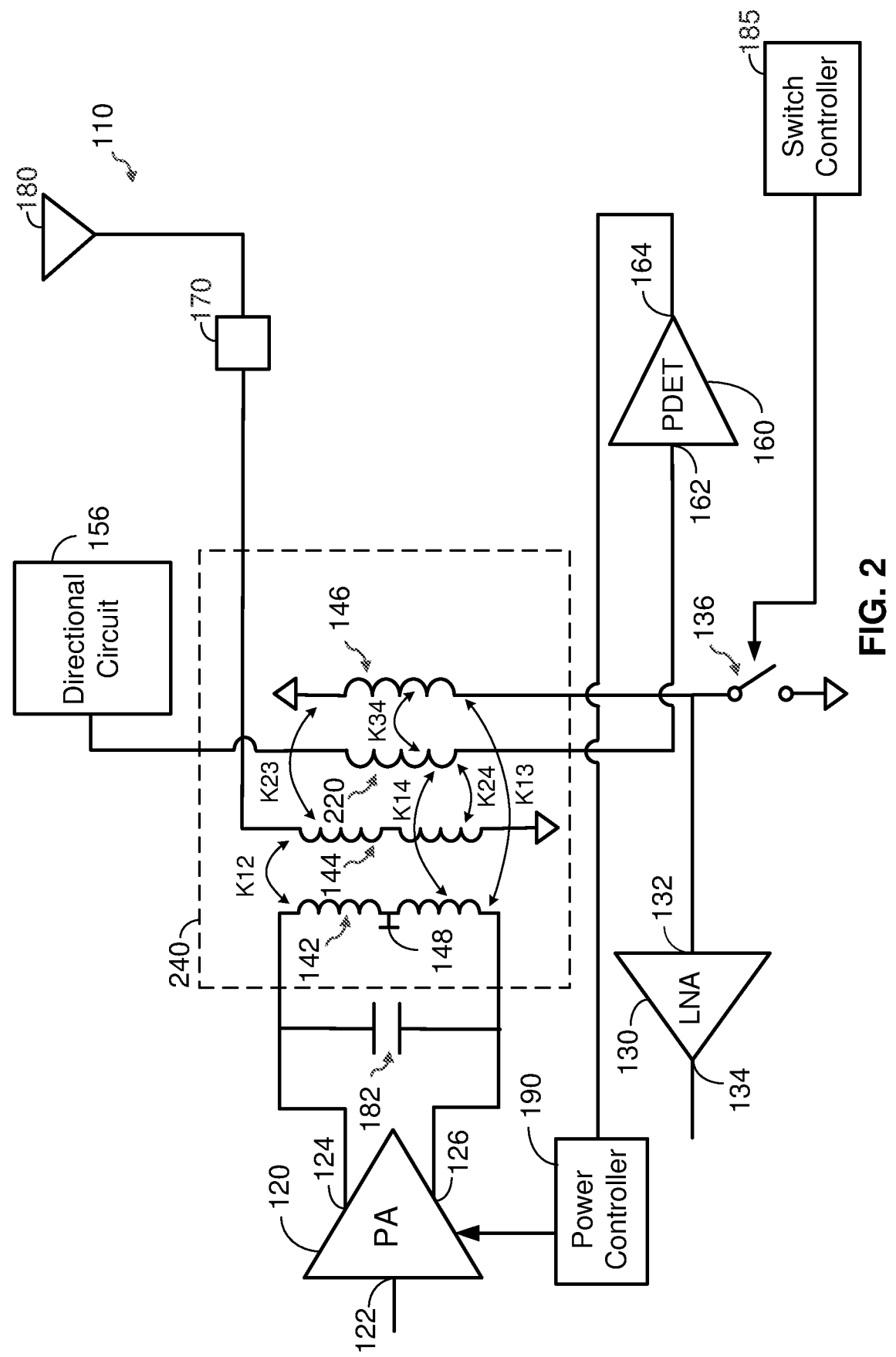
FIG. 2 shows an example of a transformer including a coupling inductor for a power detector according to certain aspects of the present disclosure.

FIG. 2 shows an example of the wireless device 110 in which the transformer 140 shown in FIG. 1 is replaced by the exemplary transformer 240 shown in FIG. 2. The transformer 240 includes the first inductor 142 coupled to the PA 120, the second inductor 144 coupled to the antenna 180, and the third inductor 146 coupled to the LNA 130 discussed above with reference to FIG. 1. As discussed above, the first inductor 142 and the second inductor 144 are magnetically coupled (i.e., inductively coupled), and the second inductor 144 and the third inductor 146 are magnetically coupled (inductively coupled).

The exemplary transformer 240 also includes a coupling inductor 220 coupled between the directional circuit 156 and the input 162 of the power detector 160. The coupling inductor 220 may also be referred to as a fourth inductor or another term. The coupling inductor 220 is magnetically coupled (i.e., inductively coupled) to at least one of the first inductor 142 and the second inductor 144 to sample (i.e., sense) the RF signal output by the PA 120 in the transmit mode for power detection. In FIG. 2, the magnetic coupling between the first inductor 142 and the coupling inductor 220 is represented by the double arrow between the first inductor 142 and the coupling inductor 220, and the magnetic coupling between the second inductor 144 and the coupling inductor 220 is represented by the double arrow between the second inductor 144 and the coupling inductor 220.

The directional circuit 156 is configured to direct current induced into the coupling inductor 220 to the power detector 160. As a result, the directional circuit 156 directs the sampled RF signal to the input 162 of the power detector 160. This allows the power detector 160 to measure the power of the RF signal for power control or other purposes, as discussed further below. In the example shown in FIG. 2, the transformer 240 is a quadcoil transformer since the transformer 240 also includes the coupling inductor 220, which may also be referred to as the fourth inductor. However, it is to be appreciated that the transformer 240 is not limited to a quadcoil transformer. For example, in some implementations, the transformer 240 may include one or more additional inductors in addition to the inductors 142, 144, 146, and 220 shown in the example in FIG. 2.

Since the coupling inductor 220 for power detection is located inside the transformer 240, the coupler 150 between the second inductor 144 and the antenna 180 shown in FIG. 1 is omitted. As a result, the second inductor 144 is coupled to the antenna 180 without the coupler 150. This eliminates the negative impact of the coupler 150 on loadline flatness and transmission power loss, allowing the wireless device 110 to achieve a loadline flatness over a wide frequency range (e.g., 37-43 GHz) using a smaller capacitance for the capacitor 182, which reduces the NF in the receive mode. The coupling inductor 220 inside the transformer 240 also reduces area compared with FIG. 1 by removing the need for the two coupling inductors 152 and 154 used in the coupler 150 of FIG. 1.

Figure 3:
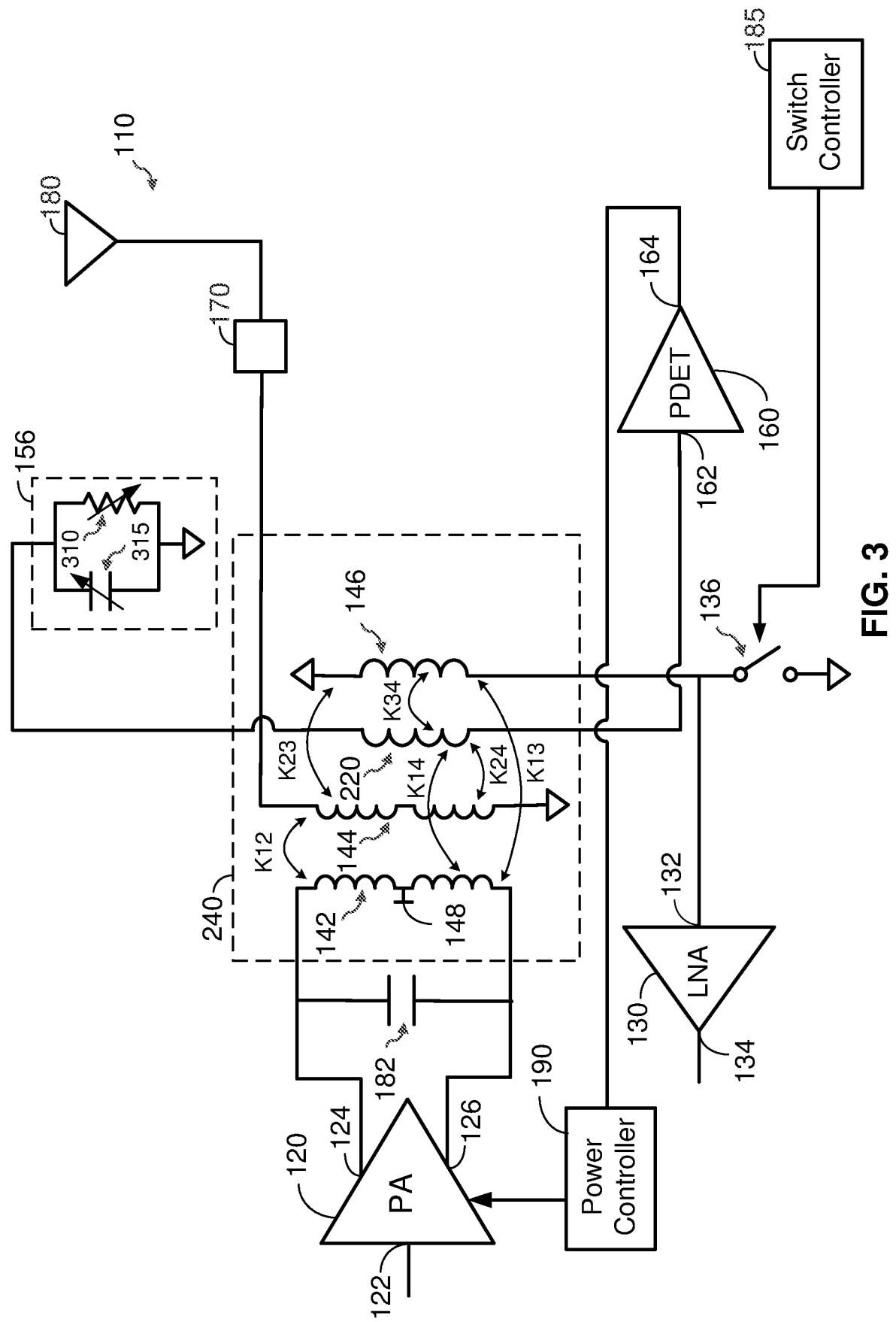
FIG. 3 shows an exemplary implementation of a directional circuit according to certain aspects of the present disclosure.

FIG. 3 shows an exemplary implementation of the directional circuit 156 according to certain aspects of the present disclosure. In this example, the directional circuit 156 includes a variable capacitor 315 and a variable resistor 310 arranged in parallel, in which the impedance of the directional circuit 156 at a certain frequency can be tuned by tuning the capacitance of the variable capacitor 315 and/or tuning the resistance of the variable resistor 310. In this example, the impedance of the directional circuit 156 may be tuned to an impedance that directs the sampled RF signal on the coupling inductor 220 to the input 162 of the power detector 160 for power detection. It is to be appreciated that the directional circuit 156 is not limited to the exemplary implementation shown in FIG. 4, and that other implementations providing an impedance that directs the sampled RF signal to the power detector 160 may be used.

Figure 4:
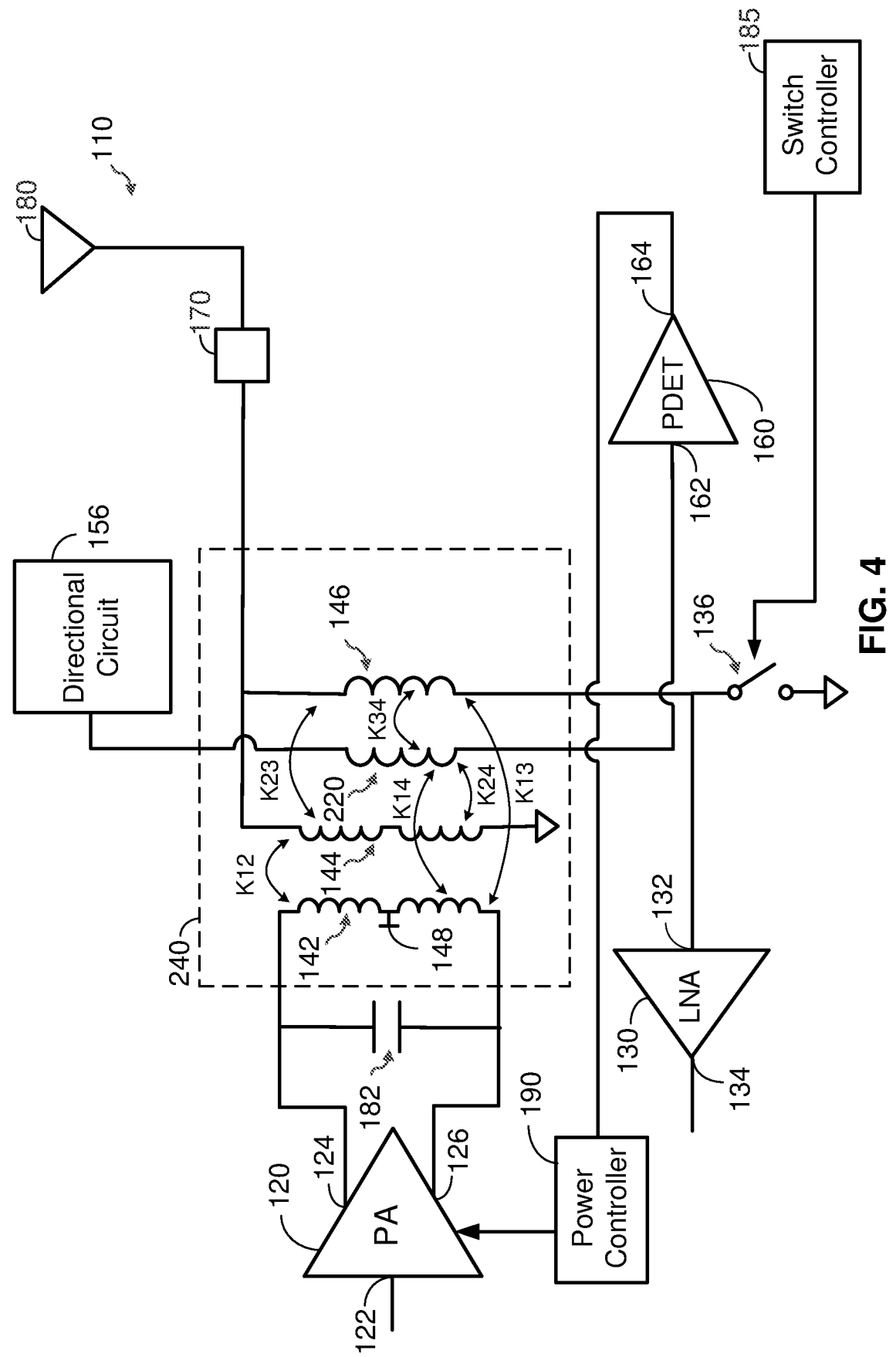
FIG. 4 shows an example of an inductor coupled between an antenna and a low-noise amplifier according to certain aspects of the present disclosure.

FIG. 4 shows an example in which the third inductor 146 is coupled between the antenna 180 and the input 132 of the LNA 130. In this example, the RF signal received by the antenna 180 in the receive mode may be coupled to the input 132 of the LNA 130 via a direct path through the third inductor 146 and via magnetic coupling between the second inductor 144 and the third inductor 146.

Figures 5A, 5B:
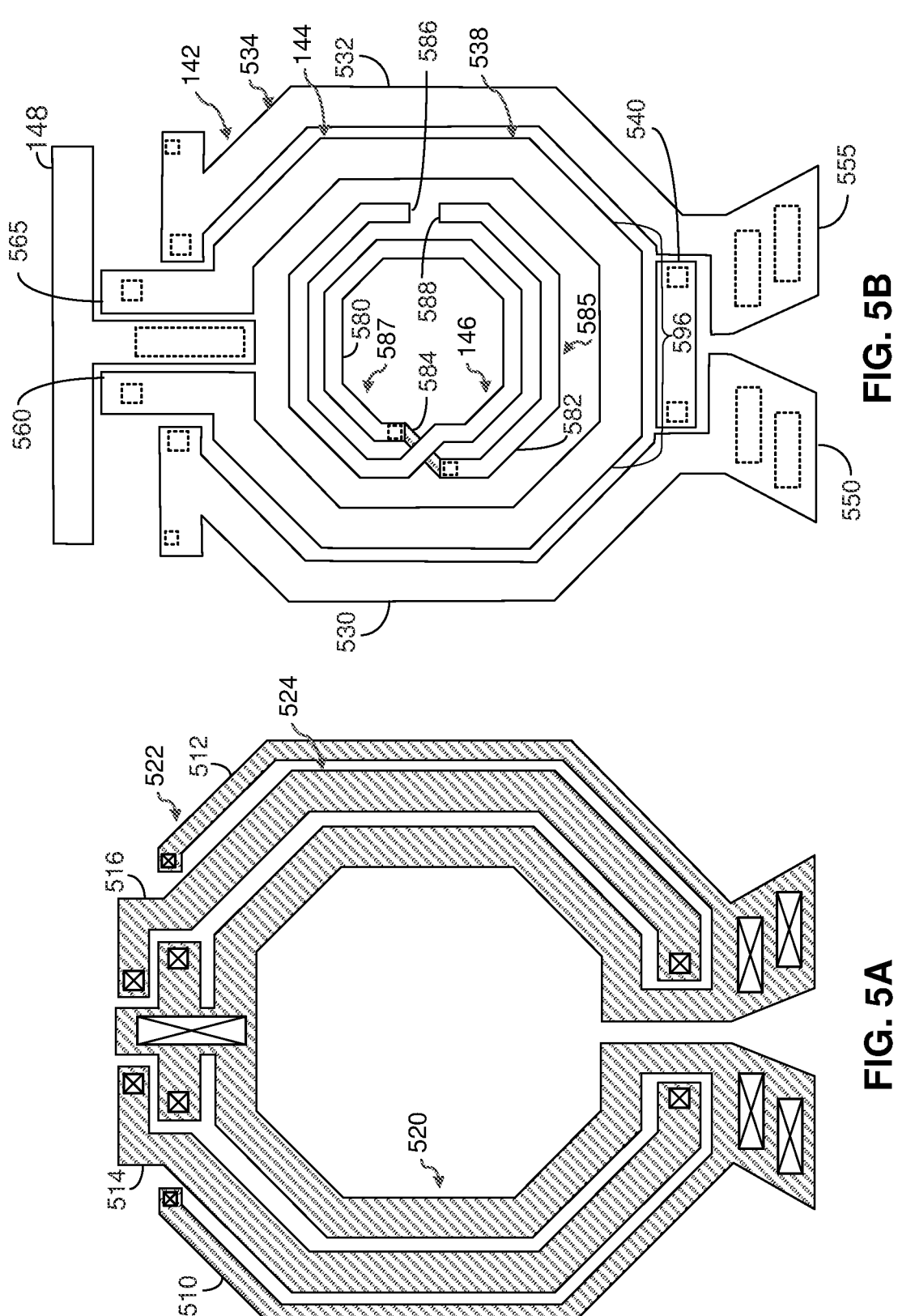
FIG. 5A shows a top view of an example of a first layer of a first inductor and a second inductor according to certain aspects of the present disclosure.
FIG. 5B shows a top view of an example of a second layer of the first inductor and the second inductor of FIG. 5A according to certain aspects of the present disclosure.
Figure 5C:
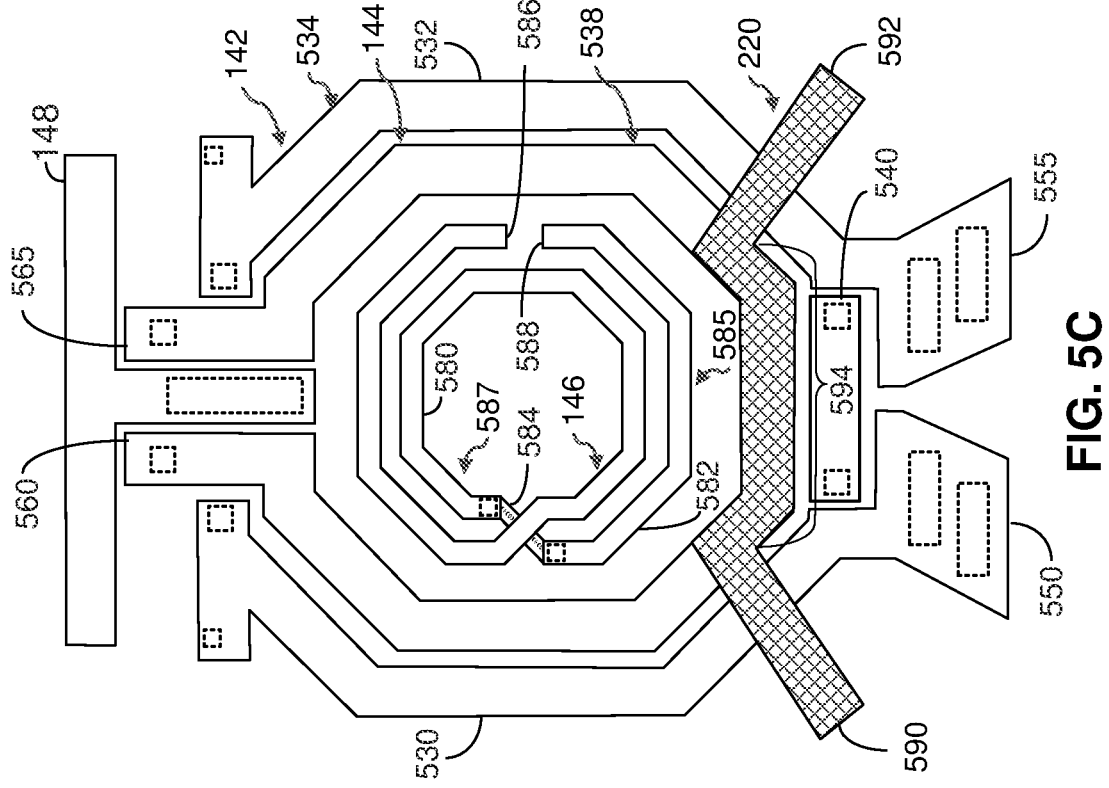
FIG. 5C shows a top view of a coupling inductor overlapping the second inductor of FIGS. 5A and 5B according to certain aspects of the present disclosure.

FIGS. 5A to 5C show an exemplary implementation of the transformer 240 according to certain aspects of the present disclosure. In this example, the inductors 142, 144, 146, and 220 are formed (i.e., patterned) from multiple metal layers (e.g., using lithographic and etching processes). The metal layers may be deposited on and/or embedded in a substrate (e.g., a silicon substrate, a laminate, a printed circuit board, etc.).

FIG. 5A shows a top view of portions of the first inductor 142 and the second inductor 144 formed in a first metal layer, and FIG. 5B shows a top view of portions of the first inductor 142 and the second inductor 144 formed in a second metal layer, which is above the first metal layer. An electrically insulating material may be disposed between the first metal layer and the second metal layer.

Referring to FIG. 5A, the first inductor 142 includes a first loop inductor 520 in the first metal layer. The first inductor 142 also includes a first portion 510 and a second portion 512 in the first metal layer. As discussed further below, the first portion 510 and the second portion 512 are coupled through the second metal layer to form a second loop inductor 522. In the example in FIG. 5A, the first loop inductor 520, the first portion 510, and the second portion 512 are contiguous in the first metal layer. However, it is to be appreciated that this need not be the case in other implementations.

FIG. 5A also shows vias disposed on the first metal layer. In FIG. 5A, each via is presented by a rectangle or a square with an "X". The vias provide electrical coupling between structures in the first metal layer and structures in the second metal layer, as discussed further below.

Referring to FIG. 5B, the first inductor 142 also includes a third portion 530 and a fourth portion 532 in the second metal layer. As discussed further below, the third portion 530 and the fourth portion 532 are coupled through the first metal layer to form a third loop inductor 534. FIG. 5B also shows an example of the center tap 148 in the second metal layer.

As discussed above, the center tap 148 may be coupled to a supply voltage. In FIG. 5B, the vias coupling the first metal layer and the second metal layer are shown with dotted lines to indicate that the vias are below the second metal layer (i.e., the vias are disposed between the first metal layer and the second metal layer).

Referring to FIGS. 5A and 5B, the vias couple the first portion 510 of the first inductor 542 to the second portion 512 of the first inductor 142 through a portion of the second metal layer to form the second loop inductor 522. The vias also couple the third portion 530 of the first inductor 142 to the fourth portion 532 of the first inductor 142 through a portion of the first metal layer to form the third loop inductor 534. The vias also couple the center of the second loop inductor 522 to the center tap 148, couple the center of the first loop inductor 520 to the center tap 148, and couple the center of the third loop inductor 534 to the center tap 148.

In this example, the first inductor 142 includes three loop inductors (i.e., the first loop inductor 520, the second loop inductor 522, and the third loop inductor 534) coupled in parallel between a first terminal 550 and a second terminal 555 of the first inductor 142, in which the three loop inductors share a common center tap (i.e., the center tap 148). However, it is to be appreciated that the first inductor 142 is not limited to this example, and may have a different number of loop inductors in other implementations. The first terminal 550 may be coupled to the first output 124 of the PA 120 and the second terminal 555 may be coupled to the second output 126 of the PA 120, or vice versa.

Referring back to FIG. 5A, the second inductor 144 includes a first portion 514 and a second portion 516 in the first metal layer. As discussed further below, the first portion 514 and the second portion 516 are coupled through the second metal layer to form a first loop inductor 524.

Referring to FIG. 5B, the second inductor 144 includes a third portion 540 in the second metal layer. In this example, the vias couple the first portion 514 of the second inductor 144 to the second portion 516 of the second inductor 144 through the third portion 540 to form the first loop inductor 524. As shown in FIG. 5A, the first loop inductor 524 of the second inductor 144 is located between the first loop inductor 520 and the second loop inductor 522 of the first inductor 142, which helps provide a high coupling coefficient K12 between the first inductor 142 and the second inductor 144.

Referring back to FIG. 5B, the second inductor 144 also includes a second loop inductor 538 in the second metal layer. The second loop inductor 538 of the second inductor 144 is located within the third loop inductor 534 of the first inductor 142.

Referring to FIGS. 5A and 5B, the vias couple the first loop inductor 524 and the second loop inductor 538 in parallel between a first terminal 560 and a second terminal 565 of the second inductor 144. The first terminal 560 may be coupled to the antenna 180 and the second terminal 565 may be coupled to the ground (or some reference potential), or vice versa. Thus, in this example, the second inductor 144 includes two loop inductors (i.e., the first loop inductor 524 and the second loop inductor 538) coupled in parallel. However, it is to be appreciated that the first inductor 142 is not limited to this example, and may have a different number of loop inductors in other implementations.

Referring to FIG. 5B, the third inductor 546 includes a first portion 580 and a second portion 582 in the second metal layer. The vias couple the first portion 580 to the second portion 582 through a metal routing 584 in the first metal layer to form a first loop inductor 585 and a second loop inductor 587. Note that the metal routing 584 and the vias coupling the metal routing 584 to the first portion 580 and the second portion 582 of the third inductor 146 are not shown in FIG. 5A. In this example, the second loop inductor 587 is located within the first loop inductor 585. In this regard, the first loop inductor 585 may also be referred to as an outer loop of the third inductor 146 and the second loop inductor 587 may also be referred to as an inner loop of the third inductor 146 in this example. The first loop inductor 585 and the second loop inductor 587 are configured such that current flowing between a first terminal 586 and a second terminal 588 of the third inductor 146 flow in the same direction (i.e., clockwise or counterclockwise) in the first loop inductor 585 and the second loop inductor 587. The first terminal 586 may be coupled to the input 132 of the LNA 130 and the second terminal 588 may be coupled to the ground (or some reference potential) or the antenna 180, or vice versa. In this example, the third inductor 146 is located within the loop inductors 522 and 538 of the second inductor 144, which facilitates magnetic coupling between the second inductor 144 and the third inductor 146.

FIG. 5C shows an example in which the coupling inductor 220 is formed from a third metal layer above the second metal layer (e.g., using lithographic and etching processes). In this example, the coupling inductor 220 overlaps the second inductor 144 to facilitate magnetic coupling between the coupling inductor 220 and the second inductor 144. The magnetic coupling allows the coupling inductor 220 to sample the power of the RF signal output to the antenna 180 from the PA 120. The coupling inductor 220 has a first terminal 590 and a second terminal 592, in which the first terminal 590 may be coupled to the directional circuit 156 and the second terminal 592 may be coupled to the input 162 of the power detector 160, or vice versa.

In this example, the coupling inductor 220 includes a portion 594 (shown in FIG. 5C) that substantially overlaps a portion 596 of the second inductor 144 (shown in FIG. 5B), where the shape of the portion 594 of the coupling inductor 220 substantially matches the shape of the portion 596 of the second inductor 144 (i.e., the portion 594 of the coupling inductor 220 has substantially the same shape as the portion 596 of the second inductor 144). This layout facilitates magnetic coupling between the coupling inductor 220 and the second inductor 144 for sampling the RF signal output to the antenna 180 from the PA 120. The magnetic coupling coefficient K24 between the second inductor 144 and the coupling inductor 220 in this example may be moderate (e.g., around 0.4).

In this example, the coupling inductor 220 is located away from the third inductor 146, which causes the coupling coefficient K34 between the coupling inductor 220 and the third inductor 146 to be low (e.g., below 0.1). The coupling coefficient K34 can be low since the coupling inductor 220 is not being used to sample the RF signal received by the LNA 130 from the antenna 180.

In this example, the magnetic coupling coefficient K14 between the coupling inductor 220 and the first inductor 142 may also be low (e.g., below 0.1). In this example, the coupling inductor 220 is able to sample the RF signal in the transmit mode through the magnetic coupling between the coupling inductor 220 and the second inductor 144. Thus, in this example, the coupling inductor 220 samples the RF signal in the transmit mode primarily through the magnetic coupling between the coupling inductor 220 and the second inductor 144. However, it is to be appreciated that this need not be the case in other implementations, as discussed further below.

It is to be appreciated that a loop of a loop inductor (e.g., any one of loop inductors 520, 522, 524, 534, and 538) may be an open loop (also referred to as a lobe) having a gap or an opening separating two terminals or two ends of the loop inductor. It is also to be appreciated that a loop inductor may have any one of various shapes including a U shape, a polygon shape (e.g., a square shape, a hexagonal shape, etc.), or another shape.

Figure 6B:
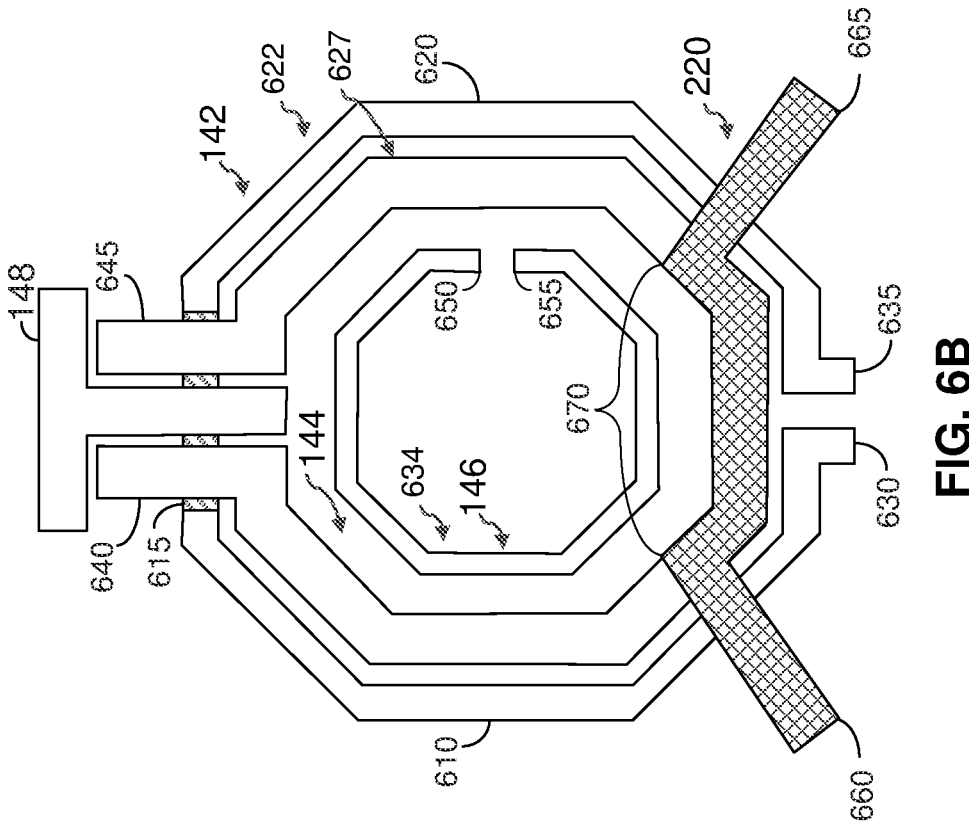
FIG. 6B shows a top view of an example of a coupling inductor overlapping the second inductor of FIG. 6A according to certain aspects of the present disclosure.
Figure 6A:
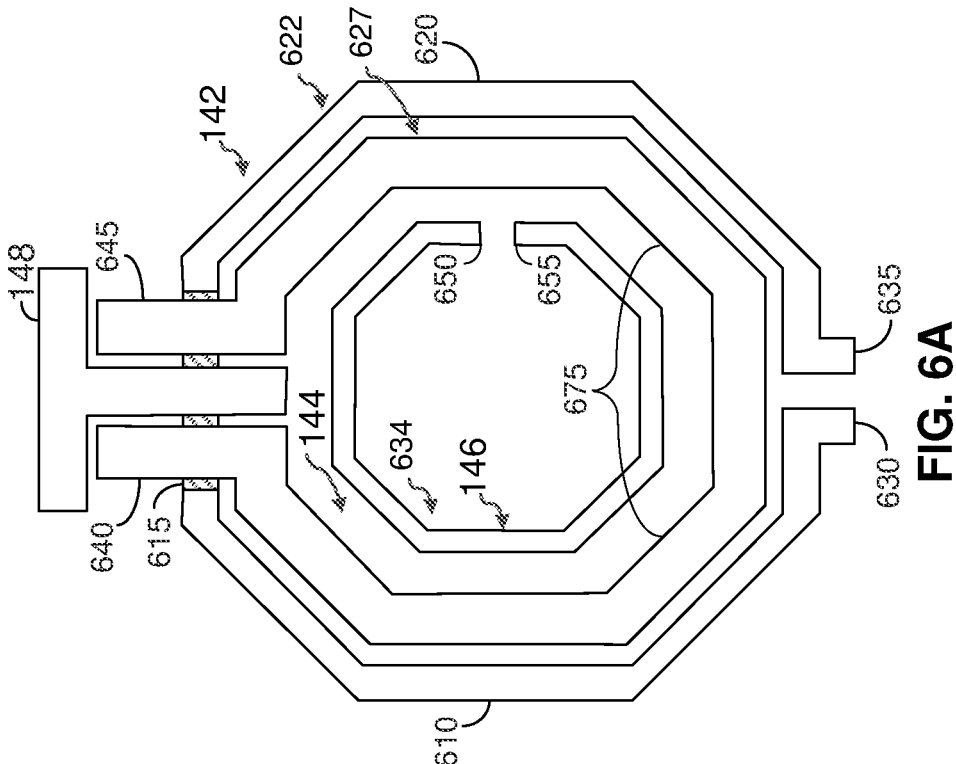
FIG. 6A shows a top view of an example of a first inductor, a second inductor, and a third inductor according to certain aspects of the present disclosure.

FIGS. 6A and 6B show another exemplary implementation of the transformer 240 according to certain aspects of the present disclosure. In this example, the inductors 142, 144, 146, and 220 may be formed (i.e., patterned) from one or more metal layers (e.g., using lithographic and etching processes). The one or more metal layers may be deposited on and/or embedded in a substrate (e.g., a silicon substrate, a laminate, a printed circuit board, etc.). FIG. 6A shows a top view of the first inductor 142, the second inductor 144, and the third inductor 146, and FIG. 6B shows an example of the coupling inductor 220 overlapping the second inductor 144, as discussed further below.

Referring to FIG. 6A, the first inductor 142 includes a first portion 610 and a second portion 620 formed from a first metal layer (e.g., using lithographic and etching processes). The first portion 610 and the second portion 620 of the first inductor 142 are coupled to each other by a metal routing 615 formed from a second metal layer below the first metal layer. The metal routing 615 may be coupled to one end of the first portion 610 by a first via (not shown) and coupled to one end of the second portion 620 by a second via (not shown).

The coupling of the first portion 610 and the second portion 620 through the metal routing 615 forms a loop inductor 622 having a first terminal 630 and a second terminal 635. The first terminal 630 may be coupled to the first output 124 of the PA 120 and the second terminal 635 may be coupled to the second output 126 of the PA 120, or vice versa. It is to be appreciated that a loop of a loop inductor may be an open loop (also referred to as a lobe) having a gap or an opening separating two terminals or two ends of the loop inductor. For example, in the example in FIG. 6A, the loop inductor 622 has a small opening separating the first terminal 630 and the second terminal 635. It is also to be appreciated that a loop inductor may have any one of various shapes including a U shape, a polygon shape (e.g., a square shape, a hexagonal shape, etc.) or another shape.

In the example in FIG. 6A, the metal routing 615 is also coupled to the center tap 148 by a third via (not shown). Thus, in this example, the center tap 148 is coupled between the first portion 610 and the second portion 620 of the first inductor 142 (e.g., the center of the loop inductor 622 formed by the first portion 610 and the second portion 620). The center tap 148 may be formed from the first metal layer or another metal layer.

It is to be appreciated that the first inductor 142 is not limited to one loop inductor. For example, in some implementations, the first inductor 142 may include one or more additional loop inductors in addition to the loop inductor 622. In this example, the loop inductor 622 and the one or more additional loop inductors may be coupled in parallel, and may be formed from one metal layer or multiple metal layers.

In the example in FIG. 6A, the second inductor 144 includes a loop inductor 627 having a first terminal 640 and a second terminal 645. The loop inductor 627 of the second inductor 144 may be formed from the first metal layer or another metal layer (e.g., using lithographic and etching processes). The first terminal 640 may be coupled to the antenna 180 and the second terminal 645 may be coupled to the ground (or some reference potential), or vice versa. In the example in FIG. 6A, the metal routing 615 passes underneath the second inductor 144.

It is to be appreciated that the second inductor 144 is not limited to one loop inductor. For example, in some implementations, the second inductor 144 may include one or more additional loop inductors in addition to the loop inductor 627. In this example, the loop inductor 627 and the one or more additional loop inductors may be coupled in parallel, and may be formed from one metal layer or multiple metal layers.

In this example, the loop inductor 627 of the second inductor 144 is located within the loop inductor 622 of the first inductor 142 to facilitate magnetic coupling between the first inductor 142 and the second inductor 144. However, it is to be appreciated that the present disclosure is not limited to this example.

In the example in FIG. 6A, the third inductor 146 includes a loop inductor 634 having a first terminal 650 and a second terminal 655. The loop inductor 634 of the third inductor 146 may be formed from the first metal layer or another metal layer (e.g., using lithographic and etching processes). The first terminal 650 may be coupled to the input 132 of the LNA 130 and the second terminal 655 may be coupled to the ground (or some reference potential) or the antenna 180, or vice versa. It is to be appreciated that the third inductor 146 is not limited to one loop inductor. For example, in some implementations, the third inductor 146 may include two or more loop inductors. For example, the third inductor 146 may be implemented with the exemplary implementation shown in FIG. 5B in which the third inductor 146 includes two loops.

In this example, the loop inductor 634 of the third inductor 146 is located within the loop inductor 627 of the second inductor 144 to facilitate magnetic coupling between the third inductor 146 and the second inductor 144. However, it is to be appreciated that the present disclosure is not limited to this example.

FIG. 6B shows an example of the coupling inductor 220 overlapping the second inductor 144 to facilitate magnetic coupling between the coupling inductor 220 and the second inductor 144. The magnetic coupling allows the coupling inductor 220 to sample the power of the RF signal output to the antenna 180 from the PA 120. The coupling inductor 220 has a first terminal 660 and a second terminal 665, in which the first terminal 660 may be coupled to the directional circuit 156 and the second terminal 665 may be coupled to the input 162 of the power detector 160, or vice versa.

The coupling inductor 220 may be formed from a third metal layer (e.g., using lithographic and etching processes), in which the third metal layer is above the first metal layer used to form the second inductor 144. In the example in FIG. 6B, the coupling inductor 220 is placed over the second inductor 144. However, it is to be appreciated that the coupling inductor 220 is not limited to this example. For example, in other implementations, the coupling inductor 220 may be placed below the second inductor 144.

In this example, the coupling inductor 220 includes a portion 670 (shown in FIG. 6B) that substantially overlaps a portion 675 of the second inductor 144 (shown in FIG. 6A), and the shape of the portion 670 of the coupling inductor 220 substantially matches the shape of the portion 675 of the second inductor 144 (i.e., the portion 670 of the coupling inductor 220 has substantially the same shape as the portion 675 of the second inductor 144). This layout facilitates magnetic coupling between the coupling inductor 220 and the second inductor 144 for sampling the RF signal output to the antenna 180 from the PA 120. The magnetic coupling coefficient K24 between the second inductor 144 and the coupling inductor 220 in this example may be moderate (e.g., around 0.4).

Figure 7B:
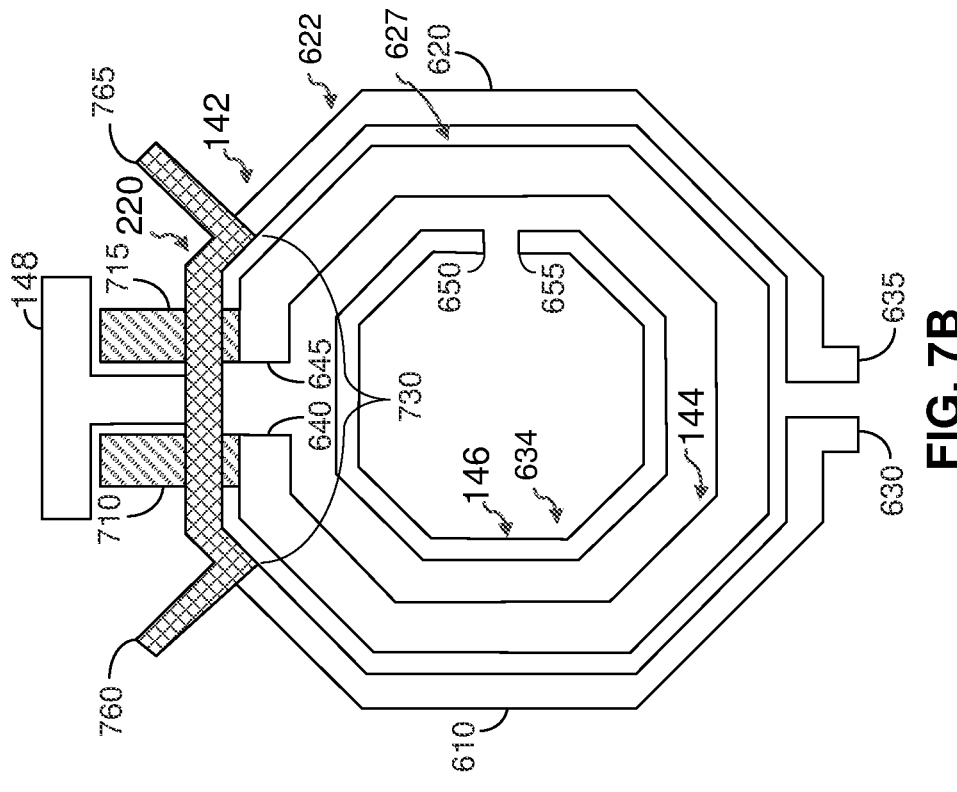
FIG. 7B shows a top view of an example of a coupling inductor overlapping the first inductor of FIG. 7A according to certain aspects of the present disclosure.
Figure 7A:
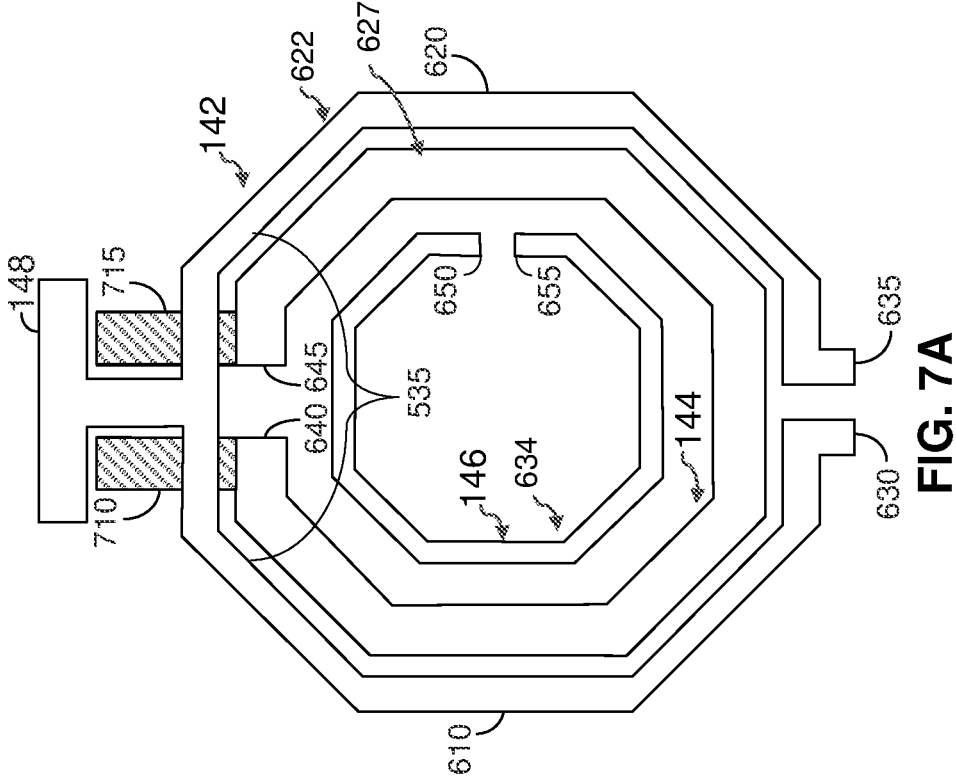
FIG. 7A shows a top view of another example of a first inductor, a second inductor, and a third inductor according to certain aspects of the present disclosure.

FIGS. 7A and 7B show another exemplary implementation of the inductors 142, 144, 146, and 220. In this example, the first portion 610 and the second portion 620 of the first inductor 142 are contiguous in the first metal layer. Since the first portion 610 and the second portion 620 are contiguous in this example, the first portion 610 is coupled to the second portion 620 without the metal routing 615 shown in FIG. 6A. Also, in this example, the center tap 148 is contiguous with the first inductor 142 in the first metal layer.

In the example in FIG. 7A, the first terminal 640 of the second inductor 144 is coupled to a first metal routing 710 by a first via (not shown), and the second terminal 645 is coupled to a second metal routing 715 by a second via (not shown). In this example, the first metal routing 710 and the second metal routing 715 pass under the first inductor 142 to provide electrical coupling to the first terminal 650 and the second terminal 655 of the second inductor 144. The first metal routing 710 may be used to couple the antenna 180 or the ground (or some reference potential) to the first terminal 450 and the second metal routing 715 may be used to couple the other one of the antenna 180 or the ground to the second terminal 645.

FIG. 7B shows an example of the coupling inductor 220 overlapping the first inductor 142 to facilitate magnetic coupling between the coupling inductor 220 and the first inductor 142. The magnetic coupling allows the coupling inductor 220 to sample the power of the RF signal output to the antenna 180 from the PA 120. A first terminal 760 of the coupling inductor 220 may be coupled to the directional circuit 156 and a second terminal 765 of the coupling inductor 220 may be coupled to the input 162 of the power detector 160, or vice versa.

The coupling inductor 220 may be formed from the third metal layer discussed above, which is above the first metal layer used to form the first inductor 142. In the example in FIG. 7B, the coupling inductor 220 is placed over the first inductor 142. However, it is to be appreciated that the coupling inductor 220 is not limited to this example. For example, in other implementations, the coupling inductor 220 may be placed below the first inductor 142.

In this example, the coupling inductor 220 includes a portion 730 (shown in FIG. 7B) that substantially overlaps a portion 735 of the first inductor 142 (shown in FIG. 7A), and the shape of the portion 730 of the coupling inductor 220 substantially matches the shape of the portion 735 of the first inductor 142 (i.e., the portion 730 of the coupling inductor 220 has substantially the same shape as the portion 735 of the first inductor 142). This layout facilitates magnetic coupling between the coupling inductor 220 and the second inductor 144 for sampling the RF signal output to the antenna 180 from the PA 120. Thus, in this example, the coupling inductor 220 samples the RF signal in the transmit mode primarily through the magnetic coupling between the coupling inductor 220 and the first inductor 142.

Figures 8A, 8B:
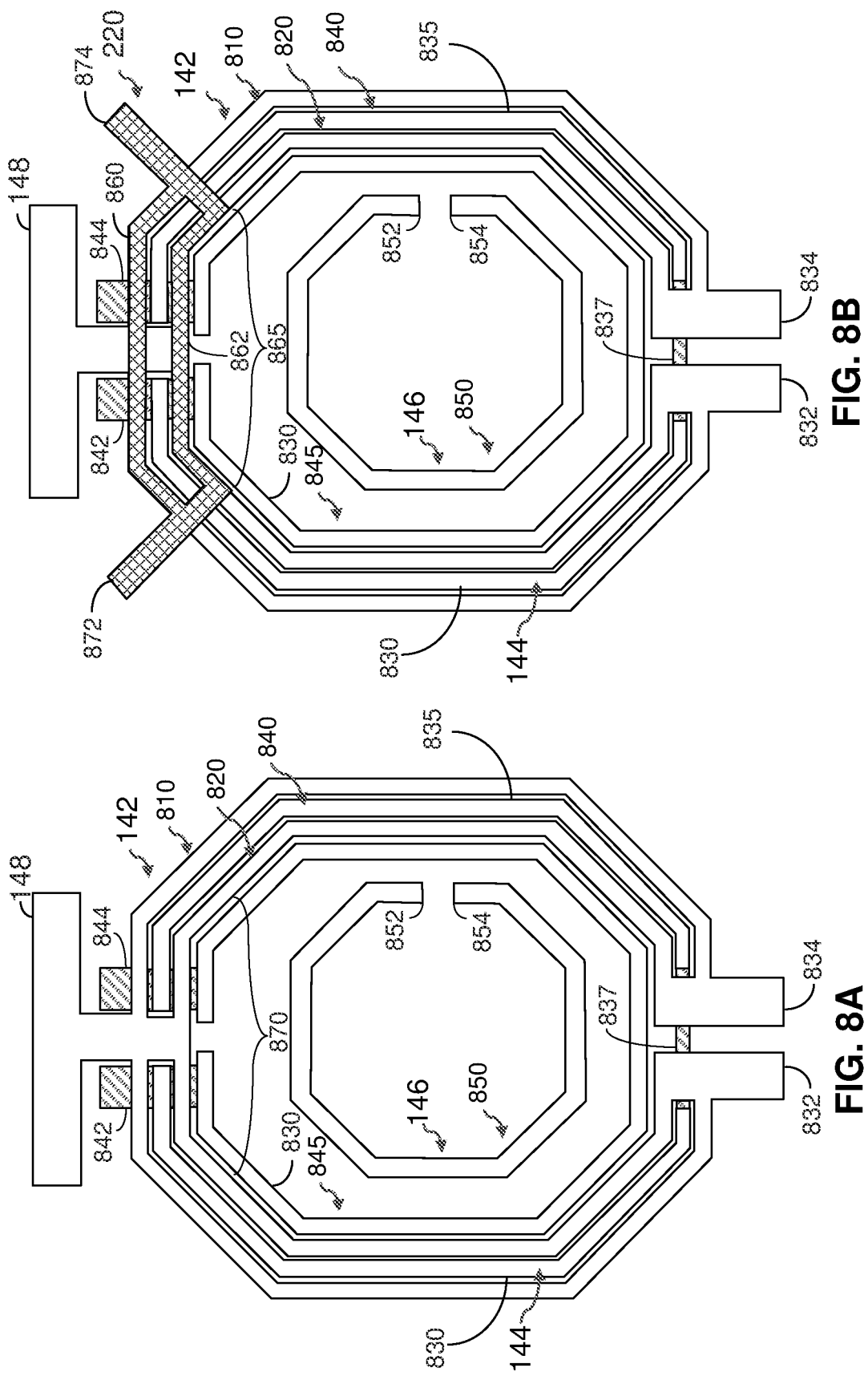
FIG. 8A shows a top view of yet another example of a first inductor, a second inductor, and a third inductor according to certain aspects of the present disclosure.
FIG. 8B shows a top view of an example of a coupling inductor overlapping the first inductor of FIG. 8A according to certain aspects of the present disclosure.

FIGS. 8A and 8B show another exemplary implementation of the inductors 142, 144, 146, and 220. In this example, the first inductor 142 includes a first loop inductor 810 and a second loop inductor 820 formed from the first metal layer. The first loop inductor 810 and the second loop inductor 820 are coupled in parallel between a first terminal 832 and a second terminal 834 of the first inductor 142. The first terminal 832 may be coupled to the first output 124 of the PA 120 and the second terminal 834 may be coupled to the second output 126 of the PA 120, or vice versa. The center tap 148 may be coupled to the center of the first loop inductor 810 and the center of the second loop inductor 820. In the example in FIG. 8A, the center tap 148 is formed from the first metal layer.

In the example in FIG. 8A, the second inductor 144 includes a first portion 830 and a second portion 835 formed from the first metal layer. A metal routing 837 couples the first portion 830 of the second inductor 144 to the second portion 835 of the second inductor 144 to form a first loop inductor 840. The metal routing 837 may be coupled to one end of the first portion 830 by a first via (not shown) and coupled to one end of the second portion 835 by a second via (not shown). The metal routing 837 may be formed from a metal layer above or below the first metal layer used to form the first portion 830 and the second portion 835 of the second inductor 144.

The second inductor 144 also includes a second loop inductor 845 formed from the first metal layer. The second loop inductor 845 is coupled in parallel with the first loop inductor 840 by a first metal routing 842 and a second metal routing 844. The first metal routing 842 and the second metal routing 844 may be formed from a metal layer above or below the first metal layer. In the example in FIG. 8A, the first metal routing 842 is coupled to a first end of the first loop inductor 840 by a via (not shown) and coupled to a first end of the second loop inductor 845 by a via (not shown). The second metal routing 844 is coupled to a second end of the first loop inductor 840 by a via (not shown) and coupled to a second end of the second loop inductor 845 by a via (not shown). In this example, the first metal routing 842 may be coupled to the antenna 180 and the second metal routing 844 may be coupled to ground (or some reference potential), or vice versa.

In the example in FIG. 8A, the first loop inductor 840 of the second inductor 144 is located between the first loop inductor 810 and the second loop inductor 820 of the first inductor 142, and the second loop inductor 845 of the second inductor 144 is located within the second loop inductor 820 of the first inductor 142. This arrangement provides strong magnetic coupling between the first inductor 142 and the second inductor 144 for efficient power transfer from the first inductor 142 to the second inductor 144 for the RF signal in the transmit mode.

In this example, the third inductor 146 includes a loop inductor 850 having a first terminal 852 and a second terminal 854. The loop inductor 850 of the third inductor 146 may be formed from the first metal layer or another metal layer (e.g., using lithographic and etching processes). The first terminal 852 may be coupled to the input 132 of the LNA 130 and the second terminal 854 may be coupled to the ground (or some reference potential) or the antenna 180, or vice versa. In this example, the third inductor 146 is located within the second loop inductor 845 of the second inductor 144 to facilitate magnetic coupling between the second inductor 144 and the third inductor 146.

FIG. 8B shows an example of the coupling inductor 220 overlapping the first inductor 142 to facilitate magnetic coupling between the coupling inductor 220 and the first inductor 142. The magnetic coupling allows the coupling inductor 220 to sample the power of the RF signal output to the antenna 180 from the PA 120. A first terminal 872 of the coupling inductor 220 may be coupled to the directional circuit 156 and a second terminal 874 of the coupling inductor 220 may be coupled to the input 162 of the power detector 160, or vice versa.

The coupling inductor 220 may be formed from the third metal layer discussed above, which is above the first metal layer used to form the first inductor 142. In the example in FIG. 8B, the coupling inductor 220 is placed over the first inductor 142. However, it is to be appreciated that the coupling inductor 220 is not limited to this example. For example, in other implementations, the coupling inductor 220 may be placed below the first inductor 142.

In this example, the coupling inductor 220 includes a portion 865 (shown in FIG. 8B) that substantially overlaps a portion 870 of the first inductor 142 (shown in FIG. 8A). The portion 865 of the coupling inductor 220 includes a first planar inductor 860 and a second planar inductor 862 coupled in parallel between the first terminal 872 and the second terminal 874. As used herein, a planar inductor is an inductor formed from a flat metal layer (e.g., using lithographic and etching processes). In this example, the first planar inductor 860 substantially overlaps a portion of the first loop inductor 810 of the first inductor 142, and the second planar inductor 862 substantially overlaps a portion of the second loop inductor 820 of the first inductor 142. In this example, the two parallel inductors (i.e., the first and second planar inductors 860 and 862) overlapping the first loop inductor 810 and the second loop inductor 820 increases magnetic coupling between the first inductor 142 and the coupling inductor 220.

In certain cases, the impedance of the antenna 180 may vary (e.g., due to changes in the environment). For example, the antenna impedance may change based on how a user is holding the wireless device 110, change due to cross talk between the antenna 180 and other antennas (not shown) that may be active on the wireless device 110, change due to a change in frequency band, and the like. Also, the antenna impedance may be affected by the geometry and/or composition of the housing used to house the antenna 180, the location and/or orientation of the antenna 180 within the housing, and the like.

The antenna impedance variation increases impedance mismatch between the antenna 180 and the PA 120, and impedance mismatch between the antenna 180 and the LNA 130. The antenna impedance variation also introduces error in the power measurement by the power detector 160.

Figure 9:
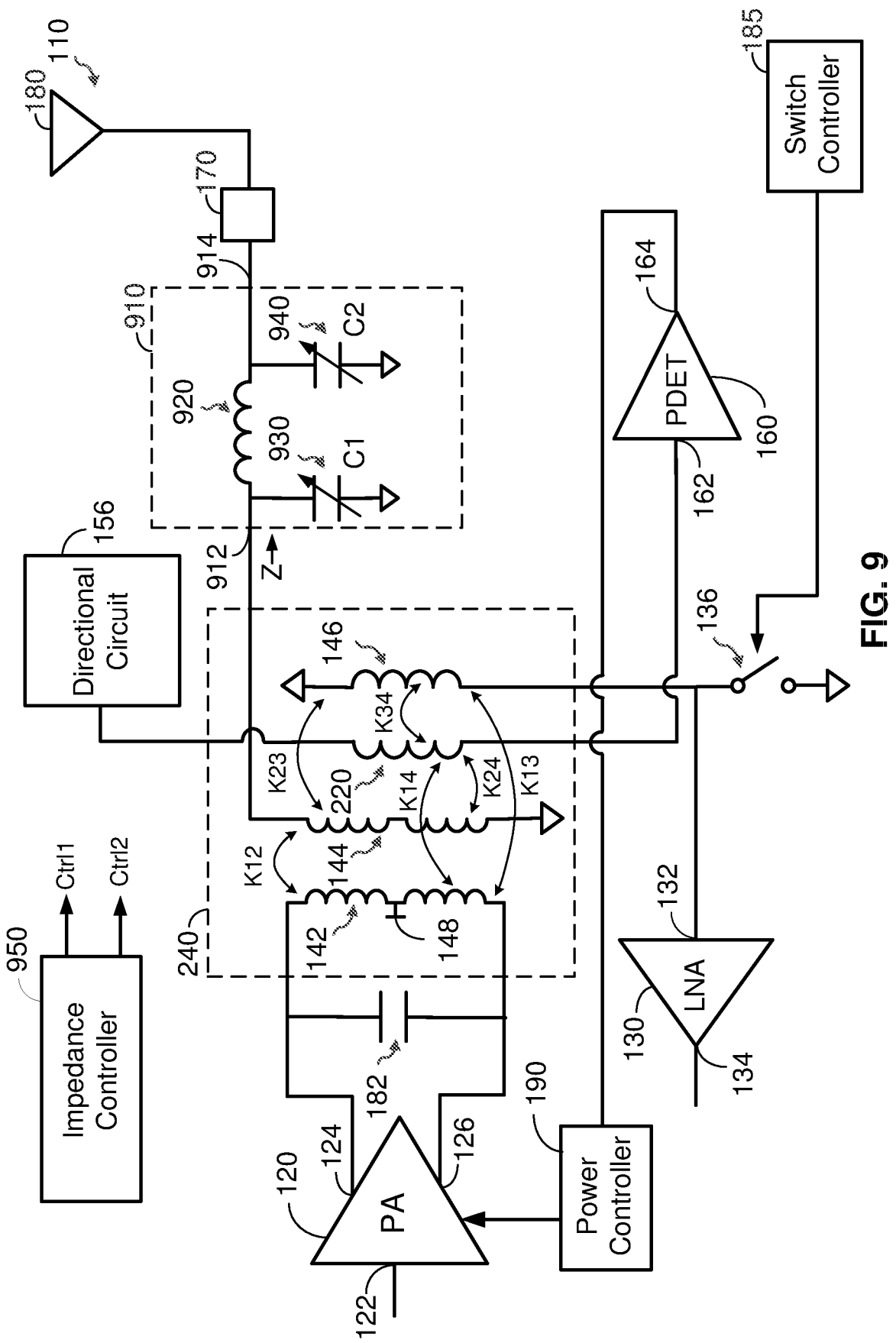
FIG. 9 shows an example of a tunable impedance matching circuit according to certain aspects of the present disclosure.

In this regard, FIG. 9 shows an example in which the wireless device 110 includes a tunable impedance matching circuit 910 to mitigate the effects of antenna impedance variation. In this example, the tunable impedance matching circuit 910 is coupled between the antenna 180 and the second inductor 144 of the transformer 240. The tunable impedance matching circuit 910 is configured to tune the impedance (labeled "Z") seen at the transformer 240 to maintain good impedance matching across variations in the antenna impedance, as discussed further below.

In the example shown in FIG. 9, the impedance matching circuit 910 has a first terminal 912 coupled to the second inductor 144 of the transformer 240, and a second terminal 914 coupled to the antenna 180 via the interface 170 (e.g., bump). The impedance matching circuit 910 is configured to tune the impedance (labeled "Z") seen by the transformer 240 (i.e., the impedance looking into the first terminal 912) to maintain good impedance matching across variations in the impedance of the antenna 180. For example, the impedance matching circuit 910 may achieve good impedance matching by tuning the impedance seen at the first terminal 912 to keep the impedance at or close to a target impedance (e.g., 50 ohms) that provides impedance matching. The good impedance matching increases the efficiency of power transfer between the PA 120 and the antenna 180, and power transfer between the antenna 180 and the LNA 130. The good impedance matching also reduces errors in the power measurement of the power detector 160 due to antenna impedance variation.

In this example, the impedance matching circuit 910 includes an inductor 920 (also referred to as an impedance matching inductor), a first capacitor 930, and a second capacitor 940. In this example, the inductor 920 is coupled between the first terminal 912 and the second terminal 914. The first capacitor 930 is coupled between the first terminal 912 and ground (or some reference potential), and the second capacitor 940 is coupled between the second terminal 914 and ground (or some reference potential). In this example, the inductor 920, the first capacitor 930, and the second capacitor 940 are arranged to form a pi impedance matching network. However, it is to be appreciated that the impedance matching circuit 910 is not limited to this example, and that other types of impedance matching networks are possible such as an L impedance matching network, a T impedance matching network, and the like.

In certain aspects, the first capacitor 930 has a first tunable capacitance C1 and the second capacitor 940 has a second tunable capacitance C2. In these aspects, the impedance seen at the first terminal 912 of the impedance matching circuit 910 is tuned by tuning the first capacitance C1 and/or tuning the second capacitance C2, as discussed further below. In the example in FIG. 9, the wireless device 110 includes an impedance controller 950 configured to tune the first capacitance C1 of the first capacitor 930 using a first control signal (labeled "Ctrl1") and tune the second capacitance C2 of the second capacitor 940 using a second control signal (labeled "Ctrl2").

In certain aspects, the first capacitor 930 and the second capacitor 940 may each be implemented with a respective digitally programmable capacitor. In these aspects, the impedance controller 950 digitally sets (i.e., programs) the first capacitance C1 of the first capacitor 930 and the second capacitance C2 of the second capacitor 940 using the respective control signals.

In certain aspects, the impedance controller 950 may store capacitance settings for the capacitors 930 and 940 for different use cases of the wireless device 110 that affect the impedance of the antenna 180. The capacitance settings for the different use cases may be stored (i.e., loaded) in a register or another type of memory. The capacitance settings for each use case may include a setting for the first capacitance C1 and a setting for the second capacitance C2 that provide good impedance matching for the use case (e.g., keep the impedance at the first terminal 912 at or close to the target impedance for the use case). In this example, the impedance controller 950 may determine the current use case of the wireless device 110, and set the first capacitance C1 and the second capacitance C2 based on the stored capacitance settings for the determined use case.

It is desirable for the inductor 920 of the impedance matching circuit 910 to have a low coupling coefficient (e.g., below 0.1) with each of the inductors 142, 144, 146, and 220. This is because large magnetic coupling between the inductor 920 and the inductors 142, 144, 146, and 220 may have a large impact on the characteristics of the transformer 240, and may complicate the design of the transformer 240 to account for the magnetic coupling with the inductor 920.

One approach to reduce magnetic coupling between the inductor 920 and the inductors 142, 144, 146, and 220 is to implement the inductor 920 with an inductor shape configured to reduce magnetic coupling between the inductor 920 and the inductors 142, 144, 146, and 220. This approach allows the inductor 920 to overlap one or more of the inductors 142, 144, 146, and 220 for high area efficiency while maintaining low magnetic coupling between inductor 920 and the inductors 142, 144, 146, and 220. An example of an inductor shape configured to reduce magnetic coupling is a figure-8 shape, which includes a first loop and a second loop configured to generate magnetic fields having opposite polarities. An inductor with a figure-8 shape may also be referred to as a figure-8 inductor, a twisted inductor, a dipole inductor, or another term.

Figure 10:
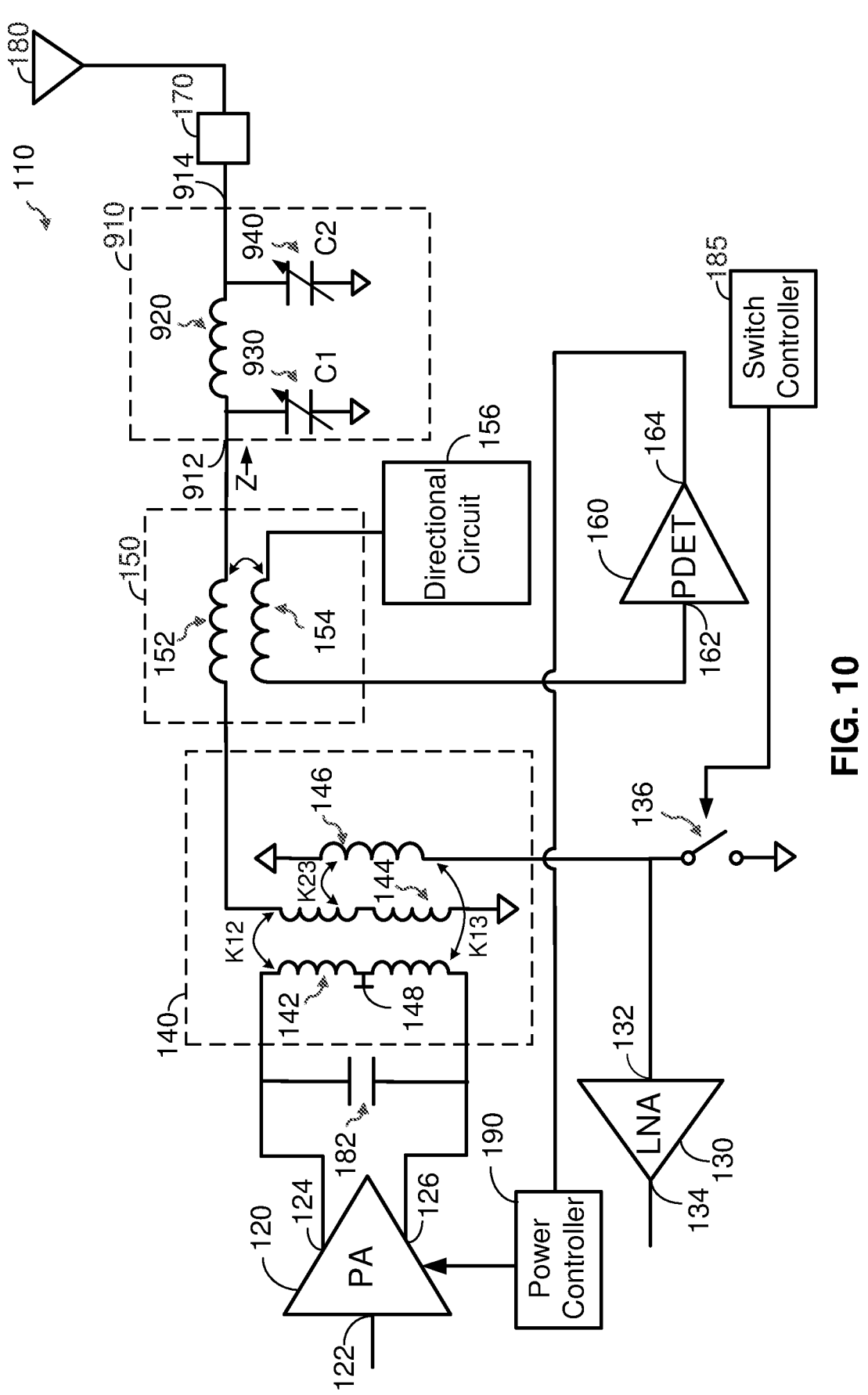
FIG. 10 shows an example of a coupler coupled between a transformer and the tunable impedance matching circuit of FIG. 9 according to certain aspects of the present disclosure.

FIG. 10 shows an example in which the coupling inductor 220 is omitted and the coupler 150 is coupled between the second inductor 144 of the transformer 140 and the first terminal 912 of the tunable impedance matching circuit 910. In this example, the first coupling inductor 152 is coupled between the second inductor 144 and the first terminal 912 of the impedance matching circuit 910, and the second coupling inductor 154 is coupled between the directional circuit 156 and the input 162 of the power detector 160. As discussed above, the coupler 150 is configured to magnetically couple a portion of the RF signal passing through the first coupling inductor 152 to the second coupling inductor 154 through the magnetic coupling between the first coupling inductor 152 and the second coupling inductor 154. The portion of the RF signal coupled to the second coupling inductor 154 is directed to the input 162 of the power detector 160 by the directional circuit 156 to measure the power of the RF signal.

As discussed above, the impedance matching circuit 910 provides good impedance matching across antenna impedance variation by maintaining the impedance seen at the first terminal 912 at or close to the target impedance. Since the coupler 150 is coupled between the transformer 140 and the first terminal 912 of the impedance matching circuit 910, the impedance matching circuit 910 helps reduce power measurement error due to impedance variation of the antenna 180.

Figure 11B:
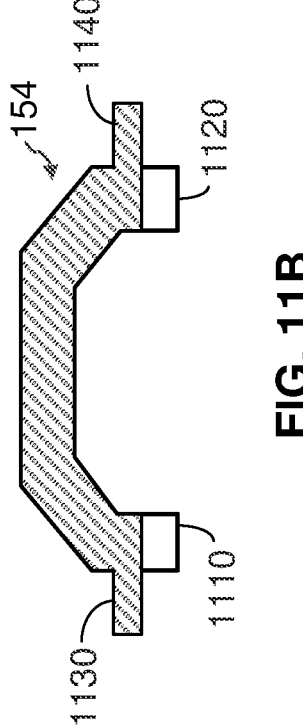
FIG. 11B shows a top view of an example of a second coupling inductor overlapping the first coupling inductor of FIG. 11A according to certain aspects of the present disclosure.
Figure 11A:
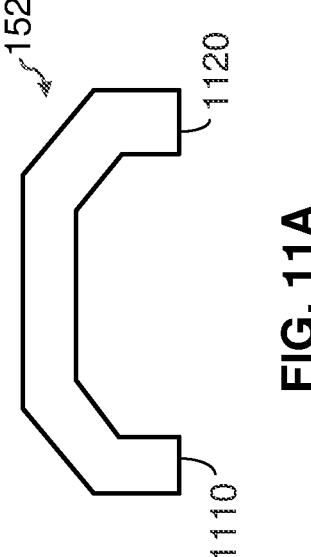
FIG. 11A shows a top view of an example of a first coupling inductor according to certain aspects of the present disclosure.

FIG. 11A shows a top view of an exemplary implementation of the first coupling inductor 152. In this example, the first coupling inductor 152 may be formed from a first metal layer (e.g., using lithographic and etching processes). The first coupling inductor 152 has a first terminal 1110 and a second terminal 1120. The first terminal 1110 may be coupled to the second inductor 144 and the second terminal 1120 may be coupled to the first terminal 912 of the impedance matching circuit 910, or vice versa.

FIG. 11B shows a top view of an example of the second coupling inductor 154 overlapping the first coupling inductor 152. In this example, the second coupling inductor 154 may be formed from a second metal layer (e.g., using lithographic and etching processes). In the example in FIG. 11B, the second metal layer is above the first metal layer. However, it is to be appreciated that the second metal layer may be below the first metal layer in other implementations. The second coupling inductor 154 has a first terminal 1130 and a second terminal 1140. The first terminal 1130 may be coupled to the directional circuit 156 and the second terminal 1140 may be coupled to the input 162 of the power detector 160, or vice versa.

Figure 12A:
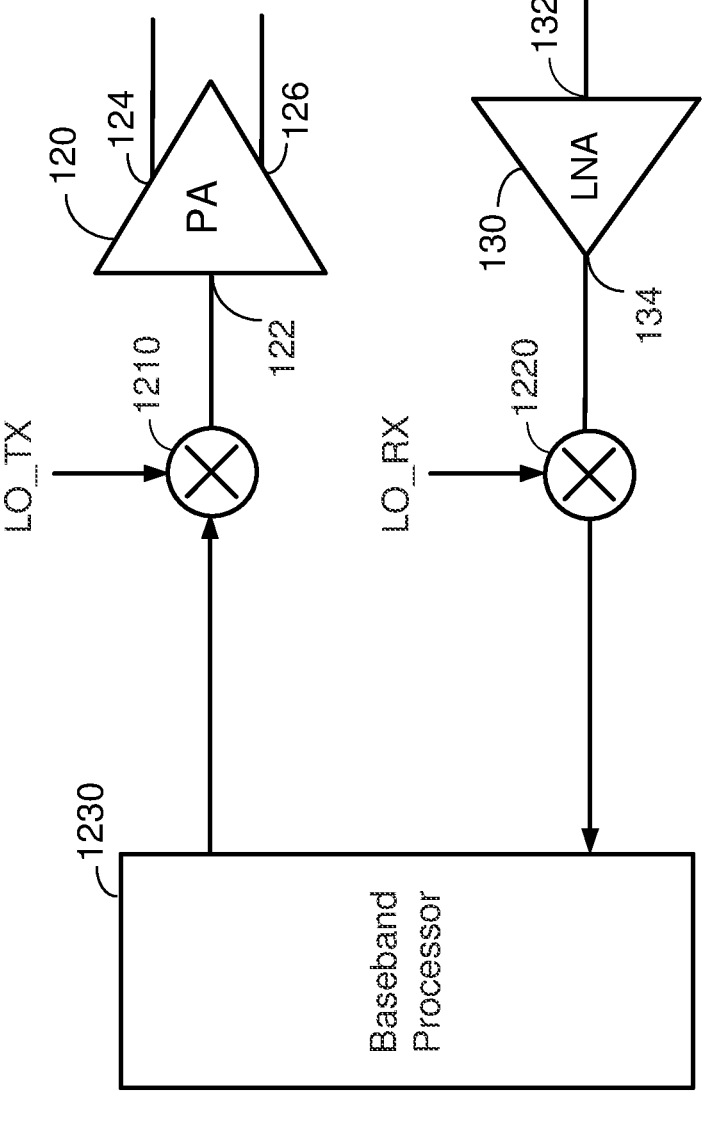
FIG. 12A shows an example of a wireless device including mixers and a baseband processor to certain aspects of the present disclosure.

FIG. 12A shows an example in which the wireless device 110 includes a first mixer 1210, a second mixer 1220, and a baseband processor 1230 (also referred to as a modem). The first mixer 1210 is coupled between the baseband processor 1230 and the input 122 of the PA 120, and the second mixer 1220 is coupled between the output 134 of the LNA 130 and the baseband processor 1230. In this example, the first mixer 1210 may receive a baseband signal from the baseband processor 1230. The first mixer 1210 is configured to mix the baseband signal with a first local oscillator signal (labeled "LO_TX") to frequency upconvert the baseband signal into an RF signal. The RF signal is input to the PA 120, which amplifiers the received RF signal and outputs the amplified RF signal to the first inductor 142 of the transformer 140 or 240 (not shown in FIG. 12A).

In this example, the LNA 130 amplifies an RF signal received from the antenna 180 and outputs the amplified signal to the second mixer 1220. The second mixer 1220 is configured to mix the RF signal from the LNA 130 with a second local oscillator signal (labeled "LO_RX") to frequency downconvert the RF signal into a baseband signal, which is processed by the baseband processor 1230. Processing performed by the baseband processor 1230 may include demodulation, decoding, and the like.

It is to be appreciated that the wireless device 110 may include one or more additional components (e.g., a filter, an amplifier, a phase shifter, and the like) in the signal path between the baseband processor 1230 and the input 122 of the PA 120, and one or more additional components (e.g., a filter, an amplifier, a phase shifter, and the like) in the signal path between the output 134 of the LNA 130 and the baseband processor 1230.

Figure 12B:
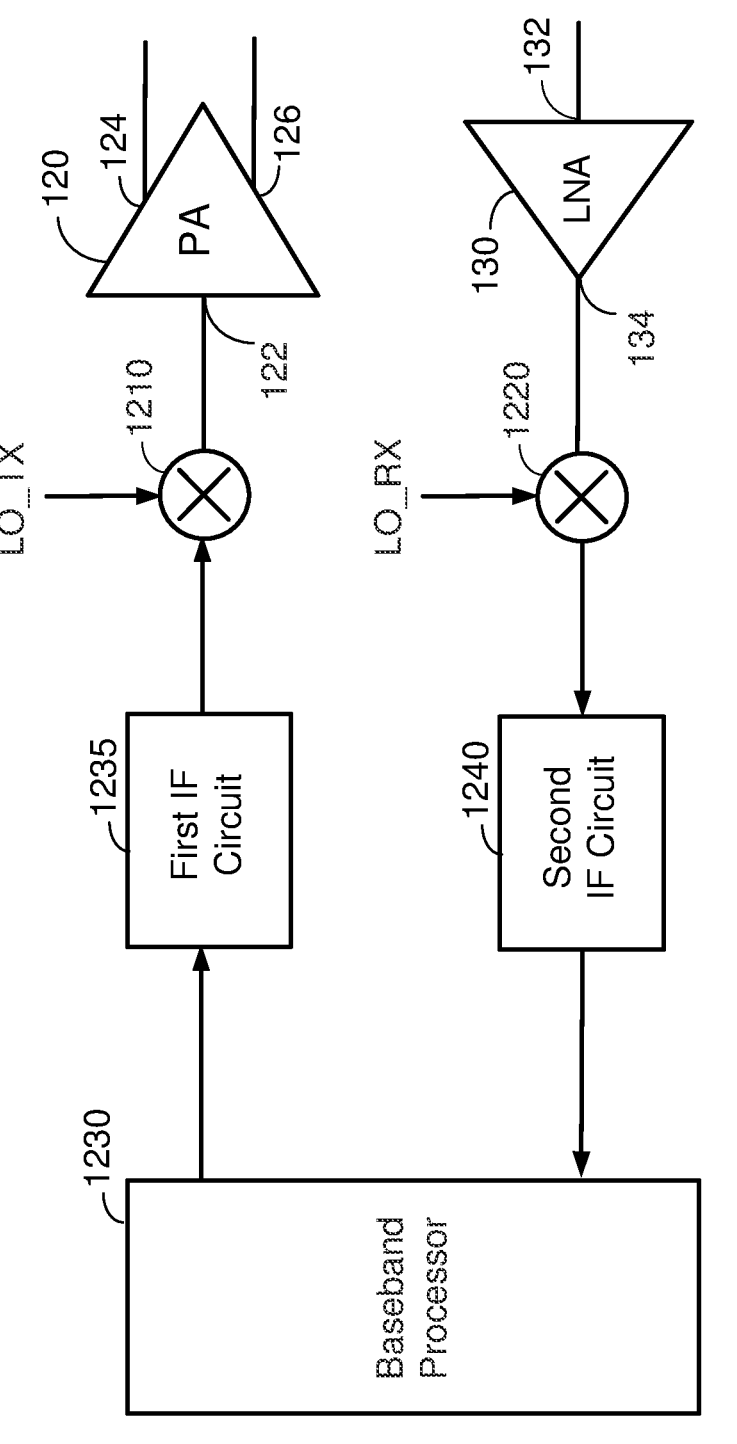
FIG. 12B shows an example of a wireless device including mixers, intermediate frequency (IF) circuits, and a baseband processor to certain aspects of the present disclosure.

FIG. 12B shows another example in which the wireless device 110 further includes a first intermediate frequency (IF) circuit 1235 coupled between the baseband processor 1230 and the first mixer 1210, and a second IF circuit 1240 coupled between the second mixer 1220 and the baseband processor 1230. In this example, the PA 120 and the LNA 130 may be included on a radio frequency front end (RFFE) chip, and the first IF circuit 1235 and the second IF circuit 1240 may be included on an IF chip coupled to the RFFE chip.

In this example, the first IF circuit 1235 is configured to receive a baseband signal from the baseband processor 1230, frequency upconvert the baseband signal into an IF signal, and output the IF signal to the first mixer 1210. The first IF circuit 1235 may include a mixer, a filter, and the like. The first mixer 1210 is configured to mix the IF signal with a first local oscillator signal (labeled "LO_TX") to frequency upconvert the IF signal into an RF signal. The RF signal is input to the PA 120, which amplifiers the received RF signal and outputs the amplified RF signal to the first inductor 142 of the transformer 140 or 240 (not shown in FIG. 12B).

In this example, the LNA 130 amplifies an RF signal received from the antenna 180 and outputs the amplified signal to the second mixer 1220. The second mixer 1220 is configured to mix the RF signal from the LNA 130 with a second local oscillator signal (labeled "LO_RX") to frequency downconvert the RF signal into an IF signal, which is output to the second IF circuit 1240. The second IF circuit 1240 is configured to frequency downconvert the IF signal into a baseband signal and output the baseband signal to the baseband processor 1230 for further processing. The second IF circuit 1240 may include a mixer, a filter, and the like. Processing performed by the baseband processor 1230 may include demodulation, decoding, and the like.

Figure 12C:
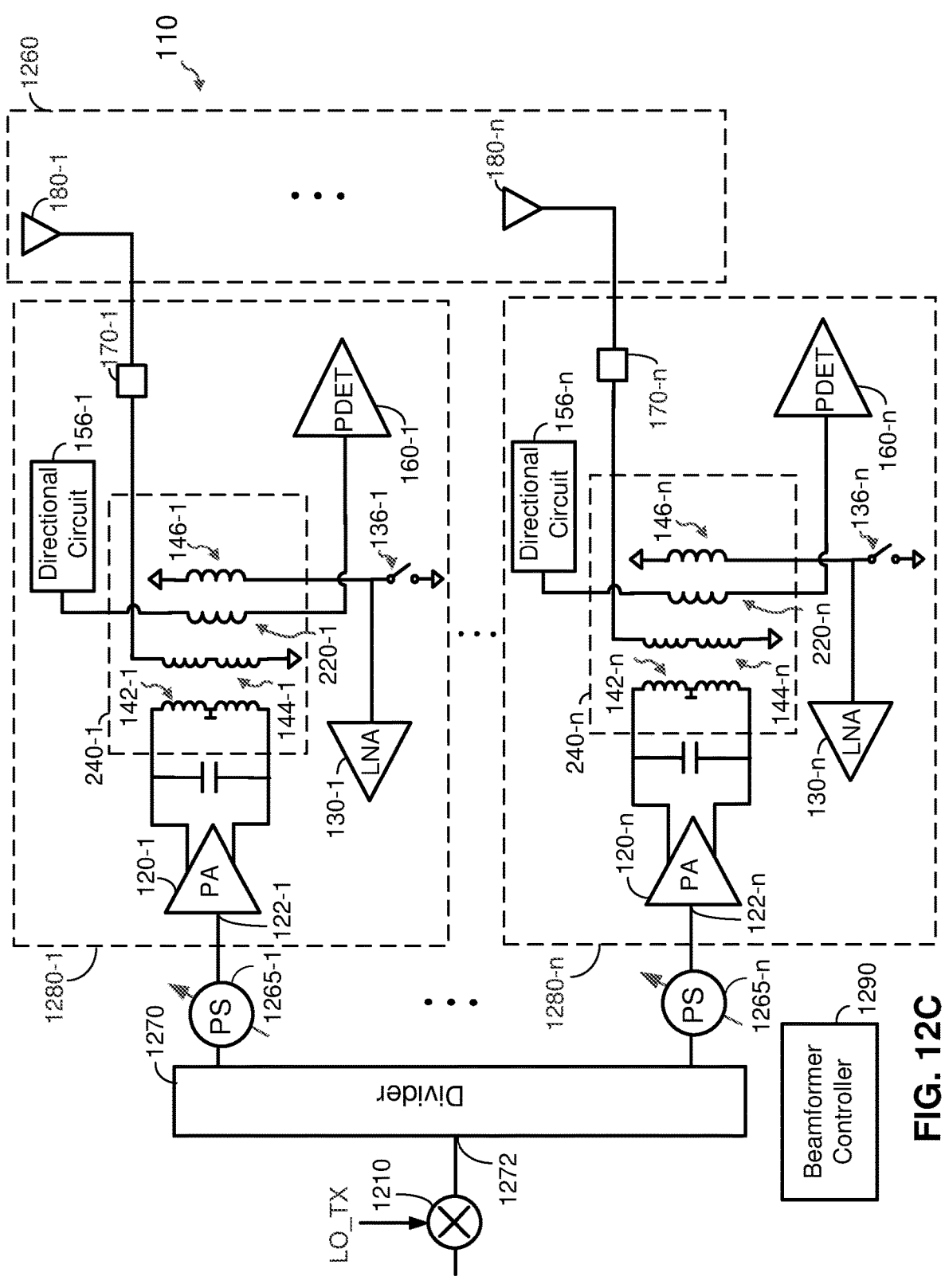
FIG. 12C shows an example of a phased array according to certain aspects of the present disclosure.

Aspects of the present disclosure may be used in to implement a phased array in the wireless device 110 as shown in the example in FIG. 12C. The phased antenna array may be used, for example, for mmWave band communication. In this example, the wireless device 110 includes an antenna array 1260 including multiple antennas 180-1 to 180-$n$ where each of the antennas 180-1 to 180-$n$ may be a separate instance of the antenna 180 shown in FIGS. 2-4, 9 and 10.

In this example, the wireless device 100 includes multiple transceiver circuits 1280-1 to 1280-$n$ where each of the transceiver circuits 1280-1 to 1280-$n$ includes a respective transformer 240-1 to 240-$n$, a respective PA 120-1 to 120-$n$, a respective LNA 130-1 to 130-$n$, a respective directional circuit 156-1 to 156-$n$, and a respective power detector 160-1 to 160-$n$. Each transformer 240-1 to 240-$n$ may be a separate instance of the transformer 240, each PA 120-1 to 120-$n$ may be a separate instance of the PA 120, each LNA 130-1 to 130-$n$ may be a separate instance of the LNA 130, each power detector 160-1 to 160-$n$ may be a separate instance of and coupled as the power detector 160, and each directional circuit 156-1 to 156-$n$ may be a separate instance of the directional circuit 156.

In each transceiver circuit 1280-1 to 1280-$n$, the respective PA 120-1 to 120-$n$ is coupled to the first inductor 142-1 to 142-$n$ of the respective transformer 240-1 to 240-$n$, and the respective the LNA 130-1 to 130-$n$ is coupled to the third inductor 146-1 to 146-$n$ of the respective transformer 240-1 to 240-$n$. The second inductor 144-1 to 144-$n$ of the respective transformer 240-1 to 240-$n$ is coupled to the respective antenna 180-1 to 180-$n$, and the respective coupling inductor 220-1 to 220-$n$ is coupled between the respective directional circuit 156-1 to 156-$n$ and the respective power detector 160-1 to 160-$n$.

The wireless device 110 also includes multiple phase shifters 1265-1 to 1265-$n$, and a power divider 1270. Each of the phase shifters 1265-1 to 1265-$n$ is coupled between the power divider 1270 and an input 122-1 to 122-$n$ of a respective PA 120-1 to 120-$n$. The power divider 1270 has an input 1272 coupled to the first mixer 1210 to receive the RF signal from the first mixer 1210. The power divider 1270 is configured to split the RF signal into multiple RF signals, and output each of the multiple RF signals to a respective one of the phase shifters 1265-1 to 1265-$n$.

Each of the phase shifters 1265-1 to 1265-$n$ is configured to shift the phase of the respective RF signal by a respective phase shift under the control of a beamformer controller 1290 and output the respective phase shifted RF signal to the input of the respective PA 120-1 to 120-$n$. For ease of illustration, the individual connections between the beamformer controller 1290 and the phase shifters 1265-1 to 1265-$n$ are not explicitly shown in FIG. 12C. In operation, the beamformer controller 1290 controls the phase shifts of the phase shifters 1265-1 to 1265-$n$ based on a desired transmit beam direction for the antenna array 1260 in the transmit mode.

Figure 13:
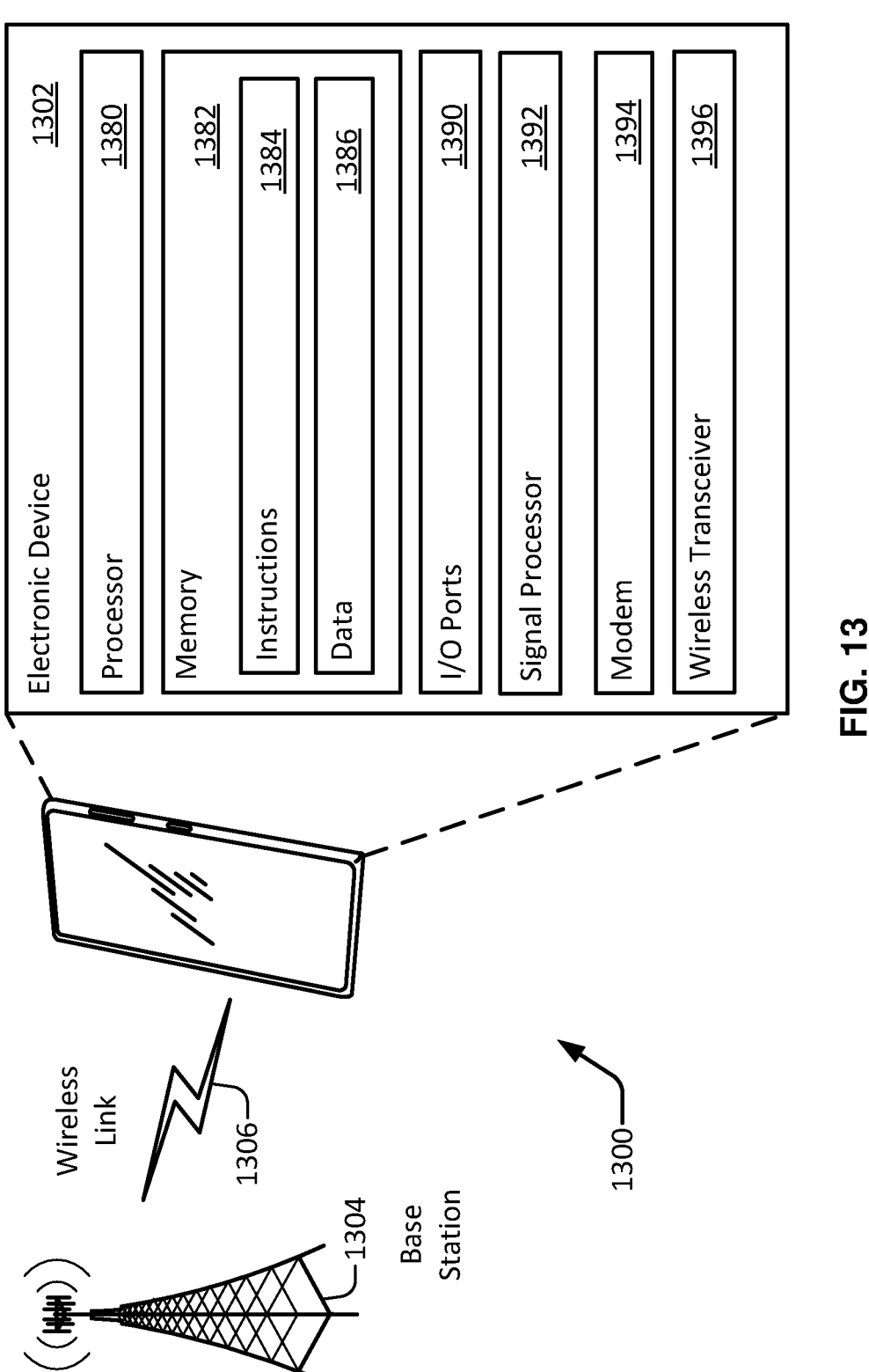
FIG. 13 is a diagram of an environment including an electronic device that includes a transceiver according to certain aspects of the present disclosure.

FIG. 13 is a diagram of an environment 1300 that includes an electronic device 1302 and a base station 1304. The electronic device 1302 may include the wireless device 110 including the antenna 180, the transformer 140 or 240, the power detector 160, the directional circuit 156, the mixers 1210 and 1220, the power controller 190, the impedance matching circuit 910, the PA 120, the LNA 130, the phase shifters 1265-1 to 1265-$n$, the power divider 1270, the IF circuits 1235 and 1240, and/or the baseband processor 1230.

In the environment 1300, the electronic device 1302 communicates with the base station 1304 via a wireless link 1306. As shown, the electronic device 1302 is depicted as a smart phone. However, the electronic device 1302 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, and so forth.

The base station 1304 communicates with the electronic device 1302 via the wireless link 1306, which may be implemented as any suitable type of wireless link. Although depicted as a base station tower of a cellular radio network, the base station 1304 may represent or be implemented as another device, such as a satellite, terrestrial broadcast tower, access point, peer to peer device, mesh network node, fiber optic line, another electronic device generally as described above, and so forth. Hence, the electronic device 1302 may communicate with the base station 1304 or another device via a wired connection, a wireless connection, or a combination thereof. The wireless link 1306 can include a downlink of data or control information communicated from the base station 1304 to the electronic device 1302 and an uplink of other data or control information communicated from the electronic device 1302 to the base station 1304. The wireless link 1306 may be implemented using any suitable communication protocol or standard, such as 3rd Generation Partnership Project Long-Term Evolution (3GPP LTE, 3GPP NR 5G), IEEE 1302.13, IEEE 1302.13, Bluetooth™, and so forth.

The electronic device 1302 includes a processor 1380 and a memory 1382. The memory 1382 may be or form a portion of a computer readable storage medium. The processor 1380 may include any type of processor, such as an application processor or a multi-core processor, that is configured to execute processor-executable instructions (e.g., code) stored in the memory 1382. The memory 1382 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the memory 1382 is implemented to store instructions 1384, data 1386, and other information of the electronic device 1302.

The electronic device 1302 may also include input/output (I/O) ports 1390. The I/O ports 1390 enable data exchanges or interaction with other devices, networks, or users or between components of the device.

The electronic device 1302 may further include a signal processor (SP) 1392 (e.g., such as a digital signal processor (DSP)). The signal processor 1392 may function similar to the processor 1380 and may be capable of executing instructions and/or processing information in conjunction with the memory 1382.

For communication purposes, the electronic device 1302 also includes a modem 1394 (e.g., the baseband processor 1230), a wireless transceiver 1396, and one or more antennas (e.g., the antenna 180). The wireless transceiver 1396 may include the transformer 140 or 240, the power detector 160, the directional circuit 156, the mixers 1210 and 1220, the power controller 190, the impedance matching circuit 910, the PA 120, the LNA 130, and/or the IF circuits 1235 and 1240. The wireless transceiver 1396 provides connectivity to respective networks and other electronic devices connected therewith using RF wireless signals. The wireless transceiver 1396 may facilitate communication over any suitable type of wireless network, such as a wireless local area network (LAN) (WLAN), a peer to peer (P2P) network, a mesh network, a cellular network, a wireless wide area network (WWAN), a navigational network (e.g., the Global Positioning System (GPS) of North America or another Global Navigation Satellite System (GNSS)), and/or a wireless personal area network (WPAN).

FIG. 14 shows a method 1400 for wireless communications according to certain aspects of the present disclosure.

At block 1410, a first radio frequency (RF) signal is amplified using a power amplifier. For example, the power amplifier may correspond to the PA 120, and the first RF signal may correspond to the RF signal in the transmit mode.

At block 1420, the amplified first RF signal is output to a first inductor. For example, the first inductor may correspond to the first inductor 142, and the PA 120 may output the amplified first RF signal to the first inductor 142.

At block 1430, the amplified first RF signal is coupled to a second inductor via magnetic coupling between the first inductor and the second inductor. For example, the second inductor may correspond to the second inductor 144.

At block 1440, the amplified first RF signal is sensed using a coupling inductor magnetically coupled with at least one of the first inductor and the second inductor. For example, the coupling inductor may correspond to the coupling inductor 220.

At block 1450, a power of the power amplifier is measured based on the sensed amplified first RF signal. For example, the power detector 160 coupled to the coupling inductor 220 may measure the power of the PA 120 based on the sensed amplified first RF signal.

The method 1400 may further include adjusting the power of the power amplifier based on the measured power. For example, the power controller 190 may adjust the power of the PA 120 based on the measured power. In certain aspects, adjusting the power of the power amplifier based on the measured power includes increasing the power of the power amplifier if the measured power is below a target power. In certain aspects, adjusting the power of the power amplifier based on the measured power includes decreasing the power of the power amplifier if the measured power is above the target power.

The method 1400 may further include transmitting the amplified first RF signal via an antenna coupled to the second inductor. The antenna may correspond to the antenna 180.

The method 1400 may further include receiving a second RF signal at the second inductor via the antenna, coupling the second RF signal to a third inductor via magnetic coupling between the second inductor and the third inductor, and amplifying the second RF signal using a low-noise amplifier coupled to the third inductor. The low-noise amplifier may correspond to the LNA 130, the third inductor may correspond to the third inductor 146, and the second RF signal may correspond to the RF signal in the receive mode.

Implementation examples are described in the following numbered clauses:

1. An apparatus for wireless communications, comprising:

a power amplifier;

a low-noise amplifier;

a power detector; and a transformer, wherein the transformer comprises:

a first inductor coupled to an output of the power amplifier;

a second inductor coupled to an antenna, wherein the second inductor is magnetically coupled with the first inductor;

a third inductor coupled to an input of the low-noise amplifier, wherein the third inductor is magnetically coupled with the second inductor; and a coupling inductor coupled to an input of the power detector, wherein the coupling inductor is magnetically coupled with at least one of the first inductor and the second inductor.

2. The apparatus of clause 1, wherein the coupling inductor overlaps the first inductor or the second inductor.

3. The apparatus of clause 2, wherein the coupling inductor does not overlap the third inductor.

4. The apparatus of any one of clauses 1 to 3, wherein:
the first inductor includes a loop inductor; and
a portion of the coupling inductor has a shape substantially matching a shape of a portion of the loop inductor.

5. The apparatus of clause 4, wherein the portion of the coupling inductor substantially overlaps the portion of the loop inductor.

6. The apparatus of any one of clauses 1 to 3, wherein:
the second inductor includes a loop inductor; and
a portion of the coupling inductor has a shape substantially matching a shape of a portion of the loop inductor.

7. The apparatus of clause 6, wherein the portion of the coupling inductor substantially overlaps the portion of the loop inductor.

8. The apparatus of clause 6 or 7, wherein the third inductor is located within the loop inductor.

9. The apparatus of any one of clauses 1 to 3, wherein:
the first inductor includes a first loop inductor and a second loop inductor, wherein the second loop inductor is located within the first loop inductor;
the coupling inductor includes a first planar inductor and a second planar inductor coupled in parallel;
the first planar inductor overlaps a portion of the first loop inductor; and
the second planar inductor overlaps a portion of the second loop inductor.

10. The apparatus of clause 9, wherein:
the first planar inductor has a shape substantially matching a shape of the portion of the first loop inductor; and
the second planar inductor has a shape substantially matching a shape of the portion of the second loop inductor.

11. The apparatus of clause 9 or 10, wherein the first loop inductor and the second loop inductor are coupled in parallel.

12. The apparatus of clause 11, wherein the second inductor includes a third loop inductor between the first loop inductor and the second loop inductor.

13. The apparatus of clause 12, wherein the second inductor includes a fourth loop inductor within the second loop inductor.

14. The apparatus of any one of clauses 1 to 13, further comprising a directional circuit, wherein the coupling inductor is coupled between the directional circuit and the input of the power detector.

15. The apparatus of clause 14, wherein the directional circuit comprises a capacitor and a resistor coupled in parallel.

16. The apparatus of any one of clauses 1 to 15, further comprising a power controller coupled between an output of the power detector and the power amplifier, the power controller configured to adjust a power of the power amplifier based on the output of the power detector.

17. The apparatus of any one of clauses 1 to 16, further comprising an impedance matching circuit coupled between the second inductor and the antenna, the impedance matching circuit including an impedance matching inductor.

18. The apparatus of clause 17, wherein the impedance matching circuit further comprises:
a first capacitor coupled between a first terminal of the impedance matching circuit and a ground, wherein the first terminal is coupled the second inductor; and
a second capacitor coupled between a second terminal of the impedance matching circuit or and the ground, wherein the second terminal is coupled to the antenna, and the impedance matching inductor is between the first terminal and the second terminal.

19. The apparatus of clause 18, wherein the first capacitor has a first tunable capacitance, and the second capacitor has a second tunable capacitance.

20. The apparatus of any one of clauses 1 to 19, further comprising:
a first mixer coupled to an input of the power amplifier; and
a second mixer coupled to an output of the low-noise amplifier.

21. The apparatus of clause 20, further comprising a baseband processor, wherein the first mixer is coupled between the baseband processor and the input of the power amplifier, and the second mixer is coupled between the output of the low-noise amplifier and the baseband processor.

22. The apparatus of clause 21, further comprising:
a first intermediate frequency (IF) circuit coupled between the first mixer and the baseband processor; and
a second IF circuit coupled to the second mixer and the baseband processor.

23. The apparatus of any one of clauses 1 to 22, wherein the antenna is one of multiple antennas in an antenna array.

24. The apparatus of clause 23, further comprising a phase shifter coupled to an input of the power amplifier.

25. The apparatus of any one of clauses 1 to 24, wherein the third inductor is coupled between the input of the low-noise amplifier and a ground.

26. The apparatus of any one of clauses 1 to 24, wherein the third inductor is coupled between the input of the low-noise amplifier and the antenna.

27. The apparatus of any one of clauses 1 to 26, wherein the apparatus includes the antenna.

28. The apparatus of clause 27, wherein the apparatus is a wireless device.

29. The apparatus of any one of clauses 1 to 28, wherein the output of the power amplifier includes a first output and a second output, and the first inductor is coupled between the first input and the second output.

30. The apparatus of any one of clauses 1 to 29, wherein the power detector is configured to measure an output power of the power amplifier.

31. The apparatus of any one of clauses 1 to 30, wherein the power amplifier is configured to receive a first radio frequency (RF) signal at an input of the power amplifier, amplify the first RF signal, and output the amplified first RF signal at the output of the power amplifier.

32. The apparatus of clause 31, wherein the low-noise amplifier is configured to receive a second radio frequency (RF) signal at the input of the low-noise amplifier, amplify the second RF signal, and output the amplified second RF signal at an output of the low-noise amplifier.

33. An apparatus for wireless communications, comprising:
a power amplifier;
a low-noise amplifier;
a transformer, wherein the transformer comprises:

a first inductor coupled to an output of the power amplifier;

a second inductor magnetically coupled with the first inductor; and a third inductor coupled to an input of the low-noise amplifier, wherein the third inductor is magnetically coupled with the second inductor;

an impedance matching circuit comprising an impedance matching inductor;

a power detector;

a first coupling inductor coupled between the second inductor and the impedance matching circuit; and a second coupling inductor coupled to an input of the power detector, wherein the second coupling inductor is magnetically coupled with the first coupling inductor.

34. The apparatus of clause 33, wherein the impedance matching circuit further comprises:

a first capacitor coupled between a first terminal of the impedance matching circuit and a ground, wherein the first terminal is coupled the second inductor; and a second capacitor coupled between a second terminal of the impedance matching circuit and the ground, wherein the second terminal is coupled to an antenna, and the impedance matching inductor is between the first terminal and the second terminal.

35. The apparatus of clause 34, wherein the first capacitor has a first tunable capacitance, and the second capacitor has a second tunable capacitance.

36. The apparatus of clause 34 or 35, wherein the apparatus includes the antenna.

37. The apparatus of any one of clauses 33 to 36, further comprising a directional circuit, wherein the second coupling inductor is coupled between the directional circuit and the input of the power detector.

38. The apparatus of clause 37, wherein the directional circuit comprises a capacitor and a resistor coupled in parallel.

39. The apparatus of any one of clauses 33 to 38, wherein the second coupling inductor overlaps the first coupling inductor.

40. The apparatus of any one of clauses 33 to 39, further comprising a power controller coupled between an output of the power detector and the power amplifier, the power controller configured to adjust a power of the power amplifier based on the output of the power detector.

41. The apparatus of any one of clauses 33 to 40, wherein the third inductor is coupled between the input of the low-noise amplifier and a ground.

42. The apparatus of any one of clauses 33 to 41, wherein the output of the power amplifier includes a first output and a second output, and the first inductor is coupled between the first input and the second output.

43. A method for wireless communications, comprising:

amplifying a first radio frequency (RF) signal using a power amplifier;

outputting the amplified first RF signal to a first inductor;

coupling the amplified first RF signal to a second inductor via magnetic coupling between the first inductor and the second inductor;

sensing the amplified first RF signal using a coupling inductor magnetically coupled with at least one of the first inductor and the second inductor; and measuring a power of the power amplifier based on the sensed amplified first RF signal.

44. The method of clause 43, further comprising adjusting the power of the power amplifier based on the measured power.

45. The method of clause 44, wherein adjusting the power of the power amplifier based on the measured power comprises increasing the power of the power amplifier if the measured power is below a target power.

46. The method of clause 45, wherein adjusting the power of the power amplifier based on the measured power comprises decreasing the power of the power amplifier if the measured power is above the target power.

47. The method of any one of clauses 43 to 46, further comprising transmitting the amplified first RF signal via an antenna coupled to the second inductor.

48. The method of clause 47, further comprising:

receiving a second RF signal at the second inductor via the antenna;

coupling the second RF signal to a third inductor via magnetic coupling between the second inductor and the third inductor; and amplifying the second RF signal using a low-noise amplifier coupled to the third inductor.

The power controller 190 and the impedance controller 950 may each be implemented with a general-purpose processor, a digital signal processor (DSP), an application specific integrated circuit (ASIC), a field programmable gate array (FPGA) or other programmable logic device, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

It is to be appreciated that the present disclosure is not limited to the exemplary terms used above to describe aspects of the present disclosure, and that the present disclosure covers equivalent terms. For example, the inductors of a transformer may also be referred to as windings of the transformer or sides of the transformer (e.g., primary side and secondary side). A coupling inductor may also be referred to as a sensing inductor, a sensing coil, or another term. The RF signal in the transmit mode (i.e., the RF signal amplified by the PA 120) may also be referred to as a first RF signal, and the RF signal in the receive mode (i.e., the RF signal amplified by the LNA 130) may also be referred to as a second RF signal.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" unless specified otherwise is used herein to refer to the direct or indirect electrical coupling between two structures. As used herein, at least one of A and B covers A, B, or A and B. As used herein, a tunable capacitor (also referred to as a variable capacitor) is a capacitor having a tunable capacitance.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus for wireless communications, comprising:
a power amplifier;
a low-noise amplifier;
a power detector; and
a transformer, wherein the transformer comprises:
a first inductor coupled to an output of the power amplifier;
a second inductor coupled to an antenna, wherein the second inductor is magnetically coupled with the first inductor;
a third inductor coupled to an input of the low-noise amplifier, wherein the third inductor is magnetically coupled with the second inductor; and
a coupling inductor coupled to an input of the power detector, wherein the coupling inductor is magnetically coupled with at least one of the first inductor and the second inductor.

2. The apparatus of claim 1, wherein the coupling inductor overlaps the first inductor or the second inductor.

3. The apparatus of claim 2, wherein the coupling inductor does not overlap the third inductor.

4. The apparatus of claim 1, wherein:
the first inductor includes a loop inductor; and
a portion of the coupling inductor has a shape substantially matching a shape of a portion of the loop inductor.

5. The apparatus of claim 4, wherein the portion of the coupling inductor substantially overlaps the portion of the loop inductor.

6. The apparatus of claim 1, wherein:
the second inductor includes a loop inductor; and
a portion of the coupling inductor has a shape substantially matching a shape of a portion of the loop inductor.

7. The apparatus of claim 6, wherein the portion of the coupling inductor substantially overlaps the portion of the loop inductor.

8. The apparatus of claim 6, wherein the third inductor is located within the loop inductor.

9. The apparatus of claim 1, wherein:
the first inductor includes a first loop inductor and a second loop inductor, wherein the second loop inductor is located within the first loop inductor;
the coupling inductor includes a first planar inductor and a second planar inductor coupled in parallel;
the first planar inductor overlaps a portion of the first loop inductor; and
the second planar inductor overlaps a portion of the second loop inductor.

10. The apparatus of claim 9, wherein:
the first planar inductor has a shape substantially matching a shape of the portion of the first loop inductor; and
the second planar inductor has a shape substantially matching a shape of the portion of the second loop inductor.

11. The apparatus of claim 9, wherein the first loop inductor and the second loop inductor are coupled in parallel.

12. The apparatus of claim 11, wherein the second inductor includes a third loop inductor between the first loop inductor and the second loop inductor.

13. The apparatus of claim 12, wherein the second inductor includes a fourth loop inductor within the second loop inductor.

14. The apparatus of claim 1, further comprising a directional circuit, wherein the coupling inductor is coupled between the directional circuit and the input of the power detector.

15. The apparatus of claim 14, wherein the directional circuit comprises a capacitor and a resistor coupled in parallel.

16. The apparatus of claim 1, further comprising a power controller coupled between an output of the power detector and the power amplifier, the power controller configured to adjust a power of the power amplifier based on the output of the power detector.

17. The apparatus of claim 1, further comprising an impedance matching circuit coupled between the second inductor and the antenna, the impedance matching circuit comprising:
a first tunable capacitor coupled between a first terminal of the impedance matching circuit and a ground, wherein the first terminal is coupled the second inductor;
a second tunable capacitor coupled between a second terminal of the impedance matching circuit and the ground, wherein the second terminal is coupled to the antenna; and
an impedance matching inductor coupled between the first terminal and the second terminal.

18. The apparatus of claim 1, further comprising:
a baseband processor;
a first mixer coupled between an input of the power amplifier and the baseband processor; and
a second mixer coupled between an output of the low-noise amplifier and the baseband processor.

19. The apparatus of claim 18, further comprising:
a first intermediate frequency (IF) circuit coupled between the first mixer and the baseband processor; and
a second IF circuit coupled between the second mixer and the baseband processor.

20. The apparatus of claim 1, wherein the antenna is one of multiple antennas in an antenna array.

21. The apparatus of claim 1, wherein the third inductor is coupled between the input of the low-noise amplifier and a ground.

22. The apparatus of claim 1, wherein the third inductor is coupled between the input of the low-noise amplifier and the antenna.

23. The apparatus of claim 1, wherein the apparatus includes the antenna.

24. The apparatus of claim 23, wherein the apparatus is a wireless device.

25. The apparatus of claim 1, wherein the output of the power amplifier includes a first output and a second output, and the first inductor is coupled between the first input and the second output.

26. The apparatus of claim 1, wherein the power detector is configured to measure an output power of the power amplifier.

27. The apparatus of claim 1, wherein:
the power amplifier is configured to receive a first radio frequency (RF) signal at an input of the power amplifier, amplify the first RF signal, and output the amplified first RF signal at the output of the power amplifier; and
the low-noise amplifier is configured to receive a second radio frequency (RF) signal at the input of the low-noise amplifier, amplify the second RF signal, and output the amplified second RF signal at an output of the low-noise amplifier.

* * * * *